US006624669B1

(12) United States Patent
Tsuchi

(10) Patent No.: US 6,624,669 B1
(45) Date of Patent: Sep. 23, 2003

(54) DRIVE CIRCUIT AND DRIVE CIRCUIT SYSTEM FOR CAPACITIVE LOAD

(75) Inventor: Hiroshi Tsuchi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/578,287

(22) Filed: May 25, 2000

(30) Foreign Application Priority Data

May 26, 1999 (JP) .......................................... 11-145768

(51) Int. Cl.[7] .................................................. H03B 1/00
(52) U.S. Cl. .......................... 327/108; 327/112; 326/83
(58) Field of Search ................................ 327/538, 541, 327/543, 108, 427, 109, 110–112, 103, 170; 323/315, 316, 313; 345/98, 87; 326/81, 83, 87; 330/288, 264, 277

(56) References Cited

U.S. PATENT DOCUMENTS

| | | | | | |
|---|---|---|---|---|---|
| 4,536,662 | A | * | 8/1985 | Fujii | 327/108 |
| 4,697,154 | A | | 9/1987 | Kousaka et al. | 345/98 |
| 4,818,901 | A | * | 4/1989 | Young et al. | 326/87 |
| 5,113,129 | A | * | 5/1992 | Hughes | 323/316 |
| 5,126,685 | A | * | 6/1992 | Platt et al. | 330/277 |
| 5,426,447 | A | | 6/1995 | Lee | |
| 5,510,807 | A | | 4/1996 | Lee et al. | |
| 5,526,014 | A | | 6/1996 | Shiba et al. | 345/96 |
| 5,590,074 | A | * | 12/1996 | Akaogi et al. | 365/185.22 |
| 5,754,078 | A | * | 5/1998 | Tamagawa | 330/264 |
| 5,754,155 | A | | 5/1998 | Kubota et al. | 345/98 |
| 5,874,934 | A | | 2/1999 | Ito | 330/277 |
| 6,037,811 | A | * | 3/2000 | Ozuc | 327/108 |
| 6,127,997 | A | | 10/2000 | Tsuchi | |

FOREIGN PATENT DOCUMENTS

| | | | |
|---|---|---|---|
| JP | 61-212907 | | 9/1986 |
| JP | 06-075543 | | 3/1994 |
| JP | 06-214527 | | 8/1994 |
| JP | 7-319429 | | 12/1995 |
| JP | 08-201763 | | 8/1996 |
| JP | 09-171372 | | 6/1997 |
| JP | 11-112247 | | 4/1999 |
| JP | 11-119741 | | 4/1999 |
| JP | 11-119750 | * | 4/1999 |
| JP | 11-259-052 | * | 9/1999 |

OTHER PUBLICATIONS 12.3: A New Low–Power TFT–LCD Driver for Portable Devices H. Tsuchi, et al. , May 14, 2000, USA.

* cited by examiner

*Primary Examiner*—Terry D. Cunningham
*Assistant Examiner*—Long Nguyen
(74) *Attorney, Agent, or Firm*—Katten Muchin Zavis Rosenman

(57) ABSTRACT

A drive circuit includes a first field effect transistor having a source connected to an input terminal and a drain and a gate connected in common, a second field effect transistor having a drain to a first power supply terminal, a source connected to an output terminal and a gate connected to the gate of the first transistor, a first current control circuit connected between the first power supply terminal and the drain of the first transistor, a second current control circuit connected between the input terminal and a second power supply terminal, and a third current control circuit connected between the output terminal and the second power supply terminal. Accordingly, the gate of the second transistor is biased with a voltage that is deviated from an input voltage by a gate-source voltage of the first transistor, so that the second transistor operates in a source-follower fashion without oscillation. Thus, the drive circuit can be constructed without including a capacitor, and therefore, a required circuit area can be reduced.

18 Claims, 25 Drawing Sheets

DRIVE CIRCUIT AND DRIVE CIRCUIT SYSTEM FOR CAPACITIVE LOAD

BACKGROUND OF THE INVENTION

The present invention relates to a drive circuit and a drive circuit system, and more specifically to a drive circuit and a drive circuit system used in a driver or a buffer which constitutes an output stage of a driving circuit for a capacitive load exemplified by a liquid crystal display (LCD).

As a typical example of a drive circuit for a capacitive load, a liquid crystal display (LCD) will be now described. In general, a display section of the liquid crystal display of an active matrix driving type includes a semiconductor substrate having transparent pixel electrodes and thin film transistors (TFT) formed thereon, an opposing substrate having a single transparent common electrode formed to cover the whole of a surface of the substrate, and a liquid crystal encapsulated between the two substrates which are located to oppose each other, separately from each other. By controlling the TFTs having a switching function, a predetermined voltage is applied to selected pixel electrodes so that a transmittance of the liquid crystal is changed by a potential difference between each pixel electrode and the opposing common electrode.

On the semiconductor substrate, data lines for supplying a plurality of different level voltages (gradation voltages) to be selectively applied to each pixel electrode, and scan lines for supplying a switching control signal for each TFT, are located. The data lines become a large capacitive load because of a liquid crystal capacitance between the data lines and the opposing common electrode and a capacitance between the data lines and the scan lines that intersect each other. Since the gradation voltage is applied through the data line to each pixel electrodes, and since the gradation voltages are written to all the pixels connected to the data lines during each one frame period, a data line drive circuit has to rapidly drive a corresponding data line which is a large capacitive load.

As mentioned above, the data line drive circuit is required to rapidly drive a corresponding data lines having a large capacitance with a high voltage precision. In order to meet with this demand, various data line drive circuits have been developed. Of the various data line drive circuits developed until now, a circuit that has enabled a high voltage precision output and a rapid driving is a drive circuit including a driver (buffer) section formed of an operational amplifier. A typical and simplest example will be shown in FIG. 16.

The operational amplifier shown in FIG. 16 is in the form of a voltage follower, capable of outputting, as an output voltage Vout, a voltage equal to an input voltage Vin. The shown operational amplifier is constituted of a differential amplifier stage 610 and an output amplifier stage 620. The differential amplifier stage 610 includes a current control circuit 601, PMOS transistors 603 and 604 having the same characteristics, and NMOS transistors 605 and 606 having the same characteristics, which are connected as shown.

In brief, the NMOS transistors 605 and 606 have respective gates connected in common, and respective sources connected in common to a power supply terminal $T_{14}$. A drain of the NMOS transistor 606 is connected to the gate of the NMOS transistor 606. The PMOS transistors 603 and 604 have respective sources connected in common. A gate of the PMOS transistor 603 is connected to an input terminal $T_1$ to receive the input voltage Vin. A drain of the PMOS transistor 603 is connected to a drain of the NMOS transistor 605. A gate of the PMOS transistor 604 is connected to an output terminal $T_2$ for outputting the output voltage Vout.

A drain of the PMOS transistor 604 is connected to the drain of the NMOS transistor 606. The current control circuit 601 is connected between a power supply terminal $T_{13}$ and the common-connected sources of the PMOS transistors 603 and 604.

On the other hand, the output amplifier stage 620 includes a current control circuit 602, an NMOS transistor 607 and a capacitor 608, connected as shown. The current control circuit 602 is connected between a power supply terminal $T_{11}$ and the output terminal $T_2$. The NMOS transistor 607 has a drain connected to the output terminal $T_2$, a source connected to a power supply terminal $T_{12}$, and a gate connected to the common-connected drains of the PMOS transistor 603 and the NMOS transistor 605. The capacitor 608 is connected between the gate of the NMOS transistor 607 and the output terminal $T_2$. Here, currents controlled by the current control circuits 601 and 602 are called I61 and I62, respectively. A voltage $V_{DD}$ is supplied to the power supply terminals $T_{11}$ and $T_{13}$, and a voltage $V_{SS}$ is supplied to the power supply terminals $T_{12}$ and $T_{14}$. In addition, the output terminal $T_2$ is connected to the data line, which is a capacitive load.

Since the output voltage Vout is fed back to the differential amplifier stage 610, namely, since the output voltage Vout is applied to the gate of the PMOS transistor 604, the operational amplifier shown in FIG. 16 has a construction having a voltage amplification factor of "1" (one) and a high current supplying capacity (voltage follower).

In operation, when the output voltage Vout is lower than the input voltage Vin, a gate voltage of the NMOS transistor 607 is lowered, so that the NMOS transistor 607 is temporarily brought into an off condition, with the result that the output voltage Vout is pulled up by the current I62 supplied through the current control circuit 602. On the other hand, when the output voltage Vout is higher than the input voltage Vin, a gate voltage of the NMOS transistor 607 is elevated, so that the output voltage Vout is pulled down by action of the NMOS transistor 607. At this time, since the NMOS transistors 605 and 606 act to flow the same current through the respective drain-source paths, the output voltage Vout is attenuated and rapidly converged to the input voltage Vin. In the operation, a phase compensation is carried out by the capacitor 608 so that oscillation is prevented.

In the above mentioned operation, a designated or selected gradation voltage is applied as the input voltage Vin during each outputting period, and the operational amplifier can drive the data line connected to the output terminal $T_2$ and having a large capacitance, by the gradation voltage with a high current supplying capacity.

In addition, the operational amplifier can drive the data line, by action of an impedance conversion, independently of a current supplying capacity of an external circuit supplying the input voltage Vin.

However, since the operational amplifier shown in FIG. 16 (voltage follower circuit) has a feed-back structure, oscillation often occurs, and therefore, it is necessary to provide the means such as a phase compensation capacitor for preventing the oscillation. Furthermore when the operational amplifier is integrated as an integrated circuit, the phase compensation capacitor often requires a large occupying chip. Therefore, when a number of operational amplifiers are built in a single integrated circuit, a required area of the integrated circuit becomes large, with the result that a production cost adversely increases.

BRIEF SUMMARY OF THE INVENTION

Accordingly, it is an object of the present invention to overcome the above mentioned problems of the prior art.

Another object of the present invention is to provide a drive circuit having a simple circuit construction which can be constituted of only transistors, and capable of stably operating with no oscillation, for rapidly driving a load with a high precision voltage output.

Still another object of the present invention is to provide a drive circuit and a drive circuit system, which can reduce the production cost when a number of drive circuits are integrated as an integrated circuit.

The above and other objects of the present invention are achieved in accordance with the present invention by a drive circuit comprising a level converting means for level-converting an input voltage into a first voltage, a first transistor having a gate connected to receive the first voltage and a source for outputting an output voltage pursuant to the input voltage, a first current control means for controlling a current flowing through a drain-source path of the first transistor so that the first transistor operates in a source follower fashion, the level converting means including a second transistor of the same conductivity type as that of the first transistor. Preferably, the second transistor has a source connected to receive the input voltage, and a drain and a gate connected in common for outputting the first voltage, and the level converting means also includes a second current control means for controlling a current flowing through a drain-source path of the second transistor.

According to another aspect of the present invention, there is provided a drive circuit comprising a first power supply terminal, an input terminal for receiving an input voltage, an output terminal for outputting an output voltage, a first transistor having a source connected to the input terminal and a drain and a gate connected in common, a second transistor of the same conductivity type as that of the first transistor, the second transistor having a drain connected to the first power supply terminal, a source connected to the output terminal, and a gate connected to receive a voltage equal to a gate voltage of the first transistor, a first current control means for controlling a current flowing through a drain-source path of the first transistor, and a second current control means for controlling a current flowing through a drain-source path of the second transistor.

In this drive circuit, the first current control means can include a first current control circuit connected between a second power supply terminal and the drain of the first transistor, and the second current control means can include a second current control circuit connected between the output terminal and a third power supply terminal. Furthermore, a third current control circuit can be connected between the input terminal and a fourth power supply terminal.

Preferably, the drive circuit can further include at least a first switch connected in series with the first transistor between the input terminal and the second power supply terminal and on-off controlled for cutting off a current flowing between the input terminal and the second power supply terminal, a second switch connected in series with second current control circuit between the output terminal and the third power supply terminal and on-off controlled for cutting off a current flowing between the output terminal and the third power supply terminal, a third switch connected in series with the third current control circuit between the input terminal and the fourth power supply terminal and on-off controlled for cutting off a current flowing between the input terminal and the fourth power supply terminal, and a fourth switch connected in series with the second transistor between the output terminal and the first power supply terminal and on-off controlled for cutting off a current flowing between the output terminal and the first power supply terminal.

In addition, the drive circuit can further include a first precharging means for precharging the output terminal to at least one predetermined voltage. In this connection, the drive circuit can further include a second precharging means for precharging the gate of the first transistor to a first predetermined voltage.

In another embodiment of the drive circuit, the first current control circuit includes a first current controlling transistor having a drain-source path connected between a second power supply terminal and the drain of the first transistor, and the second current control circuit includes a second current controlling transistor having a drain-source path connected between the output terminal and a third power supply terminal. The second current controlling transistor is of the conductivity type different from that of the first current controlling transistor. The third current control circuit includes a third current controlling transistor having a drain-source path connected between the input terminal and a fourth power supply terminal. The third current controlling transistor is of the same conductivity type as that of the second current controlling transistor. The drive circuit further includes a bias circuit having a first bias transistor and a second bias transistor connected in series. The first bias transistor is of the conductivity type different from that of the second bias transistor. The first bias transistor and the second bias transistor have a drain-source path current equal in magnitude to each other. The first bias transistor is of the same conductivity type as that of the first current controlling transistor, and has the same gate-source voltage as that of the first current controlling transistor. The second bias transistor is of the same conductivity type as that of the second and third current controlling transistors, and has the same gate-source voltage as that of the second and third current controlling transistors.

According to a third aspect of the present invention, there is provided a drive circuit system comprising an input terminal for receiving an input voltage, an output terminal for outputting an output voltage, first and second drive circuits each connected to the input terminal and the output terminal, the first drive circuit including:

- a first n-channel transistor having a source connected to the input terminal and a drain and a gate connected in common;
- a second n-channel transistor having a drain connected to a first power supply terminal, a source connected to the output terminal, and a gate connected to receive a voltage equal to a gate voltage of the first n-channel transistor;
- a first current control means for controlling a drain-source path current of the first n-channel transistor; and
- a second current control means for controlling a drain-source path current of the second n-channel transistor, the second drive circuit including:

- a first p-channel transistor having a source connected to the input terminal and a drain and a gate connected in common;
- a second p-channel transistor having a drain connected to a second power supply terminal, a source connected to the output terminal, and a gate connected to receive a voltage equal to a gate voltage of the first p-channel transistor;

a third current control means for controlling a drain-source path current of the first p-channel transistor, and a fourth current control means for controlling a drain-source path current of the second p-channel transistor.

In this drive circuit system, the first current control means can include a first control circuit connected between a third power supply terminal and the drain of the first n-channel transistor, and the second current control means can include a second current control circuit connected between the output terminal and a fourth power supply terminal. In addition, the third current control means can include a third current control circuit connected between a fifth power supply terminal and the drain of the first p-channel transistor, and the fourth current control means includes a fourth current control circuit connected between the output terminal and a sixth power supply terminal.

Preferably, the first drive circuit can further include a fifth current control circuit connected between the input terminal and a seventh power supply terminal, and the second drive circuit can include a sixth current control circuit connected between the input terminal and an eighth power supply terminal.

Furthermore, the first drive circuit can further include at least a first switch connected in series with the first n-channel transistor between the input terminal and the third power supply terminal and on-off controlled for cutting off a current flowing between the input terminal and the third power supply terminal, a second switch connected in series with the second current control circuit between the output terminal and the fourth power supply terminal and on-off controlled for cutting off a current flowing between the output terminal, and the fourth power supply terminal, a third switch connected in series with the fifth current control circuit between the input terminal and the seventh power supply terminal and on-off controlled for cutting off a current flowing between the input terminal and the seventh power supply terminal, and a fourth switch connected in series with the second n-channel transistor between the output terminal and the first power supply terminal and on-off controlled for cutting off a current flowing between the output terminal and the first power supply terminal. On the other hand, the second drive circuit can further include at least a fifth switch connected in series with the first p-channel transistor between the input terminal and the fifth power supply terminal and on-off controlled for cutting off a current flowing between the input terminal and the fifth power supply terminal, a sixth switch connected in series with the fourth current control circuit between the output terminal and the sixth power supply terminal and on-off controlled for cutting off a current flowing between the output terminal and the sixth power supply terminal, a seventh switch connected in series with the sixth current control circuit between the input terminal and the eighth power supply terminal and on-off controlled for cutting off a current flowing between the input terminal and the eighth power supply terminal, and an eighth switch connected in series with the second p-channel transistor between the output terminal and the second power supply terminal and on-off controlled for cutting off a current flowing between the output terminal and the second power supply terminal.

More preferably, the drive circuit system can further include a first precharging means for precharging the output terminal to at least one predetermined voltage. In this connection, the drive circuit system can further include a second precharging means for precharging the gate of the first n-channel transistor to a first predetermined voltage, and a third precharging means for precharging the gate of the first p-channel transistor to a second predetermined voltage.

According to a fourth aspect of the present invention, there is provided a drive circuit apparatus comprising:

a bias circuit including comprising a first transistor of a first conductivity type having a source connected to a first power supply terminal and a gate connected to receive a controlling voltage, and a second transistor of a second conductivity type opposite to the first conductivity type, the second transistor having a source connected to a second power supply terminal, and a gate and a drain connected in common to a drain of the first transistor so that the same drain-source current flows through the first transistor and the second transistor; and a drive circuit including at least one first current control transistor of the first conductivity type having the same device size as that of the first transistor, the at least one first current control transistor having a gate and a source connected to a gate and the source of the first transistor, respectively, and at least one second current control transistor of the second conductivity type having the same device size as that of the second transistor, the at least one second current control transistor having a gate and a source connected to the gate and the source of the second transistor, respectively.

With the above mentioned arrangement, a gate-source voltage of the first transistor is unambiguously determined by a drain-source current of the first transistor. Therefore, if an input voltage Vin is applied to the source of the first transistor, the gate voltage of the first transistor becomes a voltage that is deviated from the input voltage Vin by the gate-source voltage of the first transistor. On the other hand, since the drain of the second transistor receives the power supply voltage and the gate of the second transistor receives the voltage equal to the gate voltage of the first transistor, the second transistor operates in a source follower fashion. Therefore, if the drain-source current of the second transistor is controlled, the gate-source voltage of the second transistor is unambiguously determined, so that an output voltage Vout obtained from the source of the second transistor becomes stable at a voltage which is deviated from the gate voltage of the second transistor by the gate-source voltage of the second transistor.

Thus, by controlling the drain-source currents of the first and second transistors, it is possible to obtain the output voltage Vout pursuant to the input voltage Vin. In addition, when the input voltage Vin varies, the output voltage Vout rapidly changes to a voltage pursuant to the input voltage Vin, by action of the source-follower operation of the second transistor.

The above and other objects, features and advantages of the present invention will be apparent from the following description of preferred embodiments of the invention with reference to the accompanying drawings.

DETAILED DESCRIPTION OF THE INVENTION

Now, embodiments of the present invention will be described with references to the accompanying drawings. In all the drawings, elements corresponding to each other will be given the same reference numbers or signs. In addition, all the shown circuits are so constructed to minimize the number of power supply sources.

Figure 1:
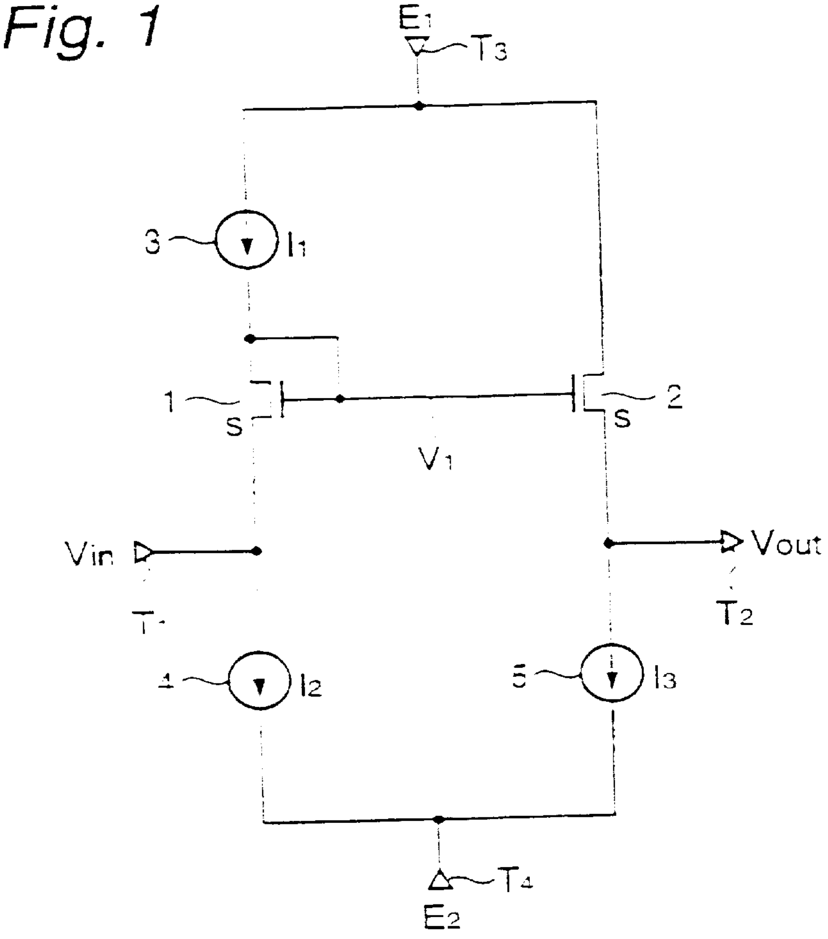
FIG. 1 is a conceptual circuit diagram of the drive circuit in accordance with a first concept of the present invention.

Referring to FIG. 1, there is shown a conceptual circuit diagram of the drive circuit in accordance with a first concept of the present invention.

The shown circuit includes two field effect transistors 1 and 2 which are of the same conductivity type and which have respective gates connected in common. The transistor 1 has a drain and the gate connected to each other, and a source connected to an input terminal $T_1$. The transistor 2 has a drain connected to a power supply terminal $T_3$ and a source connected to an output terminal $T_2$. A current control circuit 3 is connected between the power supply terminal $T_3$ and the drain of the transistor 1, for controlling a current $I_1$ which flows from the power supply terminal $T_3$ into the input terminal $T_1$. A current control circuit 4 is connected between the input terminal $T_1$ and a power supply terminal $T_4$, for controlling a current $I_2$ which flows from the input terminal $T_1$ into the power supply terminal $T_4$. A current control circuit is connected between the output terminal $T_2$ and the power supply terminal $T_4$, for controlling a current $I_3$ which flows from the output terminal $T_2$ into the power supply terminal $T_4$. Voltages $E_1$ and $E_2$ are supplied to the power supply terminals $T_3$ and $T_4$, respectively. The output terminal $T_2$ is connected to a capacitive load (not shown) such as the data line. Incidentally, the reference sign "s" in FIG. 1 indicates a source terminal of the transistors. This is applied to the other drawings.

Now, an operation of the drive circuit shown in FIG. 1 will be described. If an input voltage Vin is applied to the input terminal $T_1$, a gate voltage $V_1$ of the transistor 1 becomes a voltage which is deviated from the input voltage Vin by a gate-source voltage $Vgs_1$ of the transistor 1.

$$V_1 = Vin + Vgs_1 \qquad (1)$$

Here, the transistor has an inherent characteristics in a relation between a drain-source current Ids and a gate-source voltage Vgs (called a "Ids-Vgs characteristics" in this specification), so that the gate-source voltage $Vgs_1$ of the transistor 1 is unambiguously determined by the Ids-Vgs characteristics of the transistor 1 and the current $I_1$. Assuming that when the drain-source current of the transistor 1 is $I_1$, the gate-source voltage $Vgs_1$ of the transistor 1 becomes $Vgs_1(I_1)$, the gate voltage $V_1$ of the transistor 1 becomes stable in the following condition:

$$V_1 = Vin + Vgs_1(I_1) \qquad (2)$$

Furthermore, when the voltage $V_1$ is applied to the gate of the transistor 2, the output voltage Vout becomes a voltage that is deviated from the voltage $V_1$ by a gate-source voltage $Vgs_2$ of the transistor 2. This relation is expressed as follows:

$$Vout = Vgs_1 - Vgs_2 \qquad (3)$$

This output voltage Vout is stabilized when a drain-source current of the transistor 2 becomes equal to the current $I_3$. The gate-source voltage $Vgs_2$ of the transistor 2 in this condition becomes $Vgs_2(I_3)$ that is unambiguously determined by the Ids-Vgs characteristics of the transistor 2 and the current $I_3$. In other words, the output voltage Vout becomes stable in the following condition:

$$Vout = V_1 - Vgs_2(I_3) \qquad (4)$$

From the equations (2) and (4), when the input voltage Vin is at constant, the output voltage Vout becomes as follows:

$$Vout = V_1 in + Vgs_1(I_1) - Vgs_2(I_3) \qquad (5)$$

At this time, an output voltage range becomes a voltage difference between the power supply voltage $E_1$ and the power supply voltage $E_2$, subtracted by at least the gate-source voltage $Vgs_2(I_3)$ of the transistor 2.

Thus, if the currents $I_1$ and $I_3$ are controlled to equalize the gate-source voltages $Vgs_1(I_1)$ and $Vgs_2(I_3)$ of the transistors 1 and 2, the output voltage Vout becomes equal with the input voltage Vin, as seen from the equation (5). Furthermore, if the device size of the transistors 1 and 2 and the currents $I_1$ and $I_3$ are set to maintain the relation of "$Vgs_1(I_1)-Vgs_2(I_3)$" at a constant value even if the characteristics of transistors on the same chip varies, it is possible to supply a highly precise voltage independently of variation in the characteristics of transistors. Specifically, if the respective device sizes of the transistors 1 and 2 are set to be equal and the currents $I_1$ and $I_3$ are set to be equal, or alternatively, if the respective channel lengths of the transistors 1 and 2 are set to be equal and the currents $I_1$ and $I_3$ are set to correspond to the channel widths of the transistors 1 and 2, respectively, it is possible to supply a highly precise voltage independently of variation in threshold voltage of transistors.

Furthermore, if the current $I_2$ is controlled to be equal to the current $I_1$, even if an external circuit supplying the input voltage Vin is low in a current supply capacity, the drive circuit shown in FIG. 1 can be easily operated. Incidentally, although the current control circuit 4 was omitted, the drive circuit shown in FIG. 1 can operate. In this case, the external circuit supplying the input voltage Vin is required to have a sufficient current supply capacity.

When the input voltage Vin varies, the drive circuit shown in FIG. 1 operates as follows: When the input voltage Vin varies, if the common-connected gates of the transistors 1 and 2 have only a sufficiently small capacitance, the voltage $V_1$ relatively rapidly follows the change of the input voltage Vin, and changes to the voltage expressed by the equation (2). Here, if the input voltage Vin varies to approach the power supply voltage $E_1$, the output voltage Vout rapidly changes to the voltage expressed by the equation (5), by a source follower operation of the transistor 2. On the other hand, if the input voltage Vin varies to approach the power supply voltage $E_2$, the transistor 2 is temporarily turned off, the output voltage Vout rapidly changes to the voltage expressed by the equation (5), by the current supplying capacity of the current $I_3$. Here, the current supplying capacity in the source follower operation of the transistor 2 lowers as the gate-source voltage of the transistor 2 approaches the threshold voltage. But, the source follower operation of the transistor 2 maintains the current supplying capacity corresponding to the current $I_3$ at minimum. In other words, when the input voltage Vin varies to approach the power supply voltage $E_1$, the drive circuit shown in FIG. 1 has a high driving capacity obtained by the source follower operation of the transistor 2, and when the input voltage Vin varies to approach the power supply voltage $E_2$, the drive circuit shown in FIG. 1 has the driving capacity which depends upon the current $I_3$. Therefore, if the current $I_3$ is adjusted by the current control circuit 5, it is possible to change the driving capacity of the drive circuit shown in FIG. 1.

In the above mentioned operation, since the output terminal $T_2$ is connected to the capacitive load (not shown) such as the data line, the voltage change of the output terminal $T_2$ results in a charging or discharging of the capacitive load, but the capacitive load can be rapidly driven to a high precision voltage.

As mentioned above, the drive circuit shown in FIG. 1 can have a high driving capacity with a simple construction. In addition, if the device size of the transistors 1 and 2 and the currents $I_1$ and $I_3$ are set by considering the characteristics variation of transistors, it is possible to realize a high precision voltage output independent of the characteristics variation of transistors attributable to a device fabricating process and a temperature variation.

In FIG. 1, the transistors 1 and 2 are depicted by a schematic electronic symbol indicating a MOS transistor. However, even if the transistors 1 and 2 are constituted of the other type of field effect transistor, a similar advantage can be obtained in a similar operation. In addition, a similar advantage can be obtained even if each of the MOS transistors 1 and 2 is replaced with a bipolar transistor by considering that the drain, the gate and the source of the MOS transistors correspond to a collector, a base and an emitter of the bipolar transistor, respectively. This can be applied to the following embodiments. Therefore, in the following embodiments, a similar note will be omitted, and only the drive circuits constituted of MOS transistors will be described.

Figure 2:
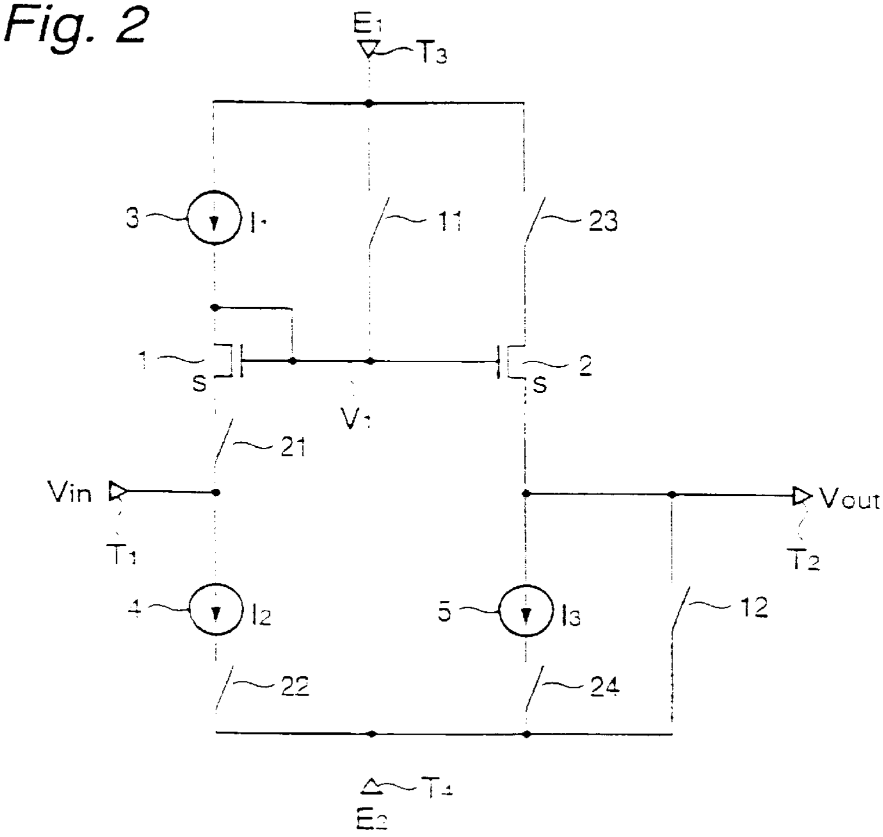
FIG. 2 is a conceptual circuit diagram of the drive circuit in accordance with a second concept of the present invention.

Referring to FIG. 2, there is shown a conceptual circuit diagram of the drive circuit in accordance with a second concept of the present invention.

The drive circuit shown in FIG. 2 is different in the drive circuit shown in FIG. 1 in the following points: As a circuit for precharging the common-connected gates of the transistors 1 and 2, a switch 11 is connected between the power supply terminal $T_3$ and the common-connected gates of the transistors 1 and 2. As a circuit for precharging the output terminal $T_2$, a switch 12 is connected between the power supply terminal $T_4$ and the output terminal $T_2$. In order to be able to cut off the drain-source current of the transistor 1, a switch 21 is connected between the input terminal $T_1$ and the source of the transistor 1. In order to be able to cut off the current $I_2$, a switch 22 is connected in series with the current control circuit 4 between the input terminal $T_1$ and the power supply terminal $T_4$. In order to be able to cut off the drain-source current of the transistor 2, a switch 23 is connected in series with the transistor 2 between the power supply terminal $T_3$ and the output terminal $T_2$. In order to be able to cut off the current $I_3$, a switch 24 is connected in series with the current control circuit between the output terminal $T_2$ and the power supply terminal $T_4$. The output terminal $T_2$ is connected to a capacitive load (not shown) such as the data line.

Figure 3:
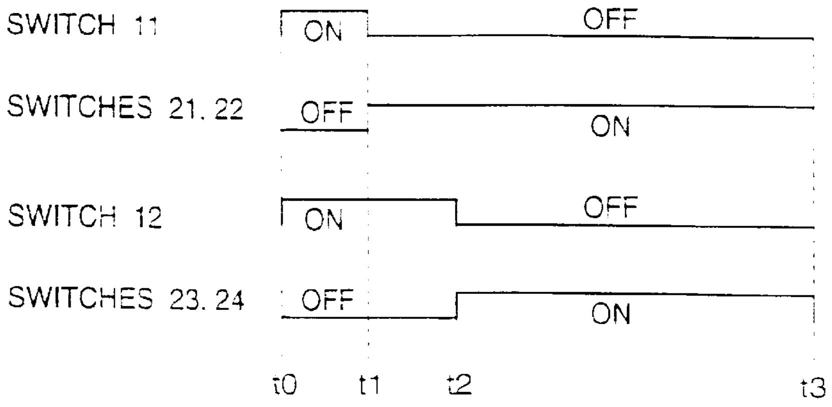
FIG. 3 is a timing chart illustrating an operation of the circuit shown in FIG. 2.

Now, an operation of the drive circuit shown in FIG. 2 will be described with reference to FIG. 3 which is a timing chart illustrating an operation of the circuit shown in FIG. 2, during one output period for outputting a selected voltage level.

First, at a time t0, the switches 11 and 12 are turned on, and the switches 21, 22, 23 and 24 are turned off. As a result, the common-connected gates of the transistors 1 and 2 are precharged to the power supply voltage $E_1$, and the output terminal $T_2$ is precharged to the power supply voltage $E_2$.

At a time t1, the switch 11 is turned off, and the switches 21 and 22 are turned on. As a result, the voltage $V_1$ at the common-connected gates of the transistors 1 and 2 rapidly changes to a voltage which is deviated from the input voltage Vin by the gate-source voltage of the transistor 1, and becomes stable at the voltage expressed by the equation (2).

At a time t2, the switch 12 is turned off, and the switches 23 and 24 are turned on. As a result, the output voltage Vout rapidly changes to the voltage expressed by the equation (5), and is maintained at the voltage expressed by the equation (5) until a time t3.

The drive circuit shown in FIG. 2 has an output voltage range similar to that of the drive circuit shown in FIG. 1. In addition, similarly to the drive circuit shown in FIG. 1, if the currents $I_1$ and $I_3$ are controlled to equalize the gate-source voltages $Vgs_1(I_1)$ and $Vgs_2(I_3)$ of the transistors 1 and 2, the output voltage Vout becomes equal with the input voltage Vin. Furthermore, if the device size of the transistors 1 and 2 and the currents $I_1$ and $I_3$ are set by taking a characteristics variation of transistors into consideration, it is possible to supply a highly precise voltage independently of the characteristics variation of transistors.

Moreover, if the current $I_2$ is controlled to be equal to the current $I_1$, even if an external circuit supplying the input voltage Vin is low in a current supply capacity, the drive circuit shown in FIG. 2 can be easily operated.

Now, features of the drive circuit shown in FIG. 2 different from those of the drive circuit shown in FIG. 1 will be described.

The drive circuit shown in FIG. 2 can be considered to be improvement to the drive circuit shown in FIG. 1, since the power consumption can be reduced without lowering the driving capacity. In the drive circuit shown in FIG. 1, when the input voltage Vin varies to approach the power supply voltage $E_2$, the drive circuit has the driving capacity depending upon the current $I_3$. If the current $I_3$ is made large, a static power consumption increases. On the other hand, when the input voltage Vin varies to approach the power supply voltage $E_1$, the drive circuit has a high driving capacity given by the source follower operation of the transistor 2. In the drive circuit shown in FIG. 2, therefore, for each one output period for, outputting a selected voltage level, the output terminal $T_2$ is precharged to the power supply voltage $E_2$, so that the voltage output of each one output period is obtained by the high driving capacity given by the source follower operation of the transistor 2. With this arrangement, although the currents $I_1$, $I_2$ and $I_3$ are limited, a high speed driving can be obtained, and the static power consumption can be reduced. Incidentally, the precharged voltage of the output terminal $T_2$ is not limited to only the power supply voltage $E_2$, if it is a voltage which enables the transistor 2 to operate in the source follower fashion during a period from the time t2 to the time t3. Therefore, it is possible to provide a plurality of precharging voltage supplies corresponding to a plurality of different input voltages Vin supplied to the input terminal $T_1$.

Furthermore, if the current $I_1$ is large at some degree, the precharging of the common-connected gates of the transistors 1 and 2 given by the switch 11 is not necessarily required. However, if the current $I_1$ is limited to an extremely small value, the charging/discharging of the gate capacitance of the transistors 1 and 2 in response to the change of the input voltage Vin needs a substantial time, with the result that the voltage of the common-connected gates of the transistors 1 and 2 cannot be rapidly changed to the voltage Vin expressed by the equation (2). In this case, if the common-connected gates of the transistors 1 and 2 are precharged at an initial stage of each one output period, the transistor 1 operates in a source follower fashion, with the result that the voltage of the common-connected gates of the transistors 1 and 2 can be rapidly changed to the voltage Vin expressed by the equation (2).

The switches 21, 22, 23 and 24 are controlled to cut off different currents flowing between the input terminal $T_1$ and the output terminal $T_2$ and the power supply terminals $T_3$ and $T_4$, during respective precharge times given by the switches 11 and 12. With this arrangement, it is possible to cut off a superfluous current, and therefore to minimize the power consumption caused by the precharging.

Incidentally, although the current control circuits 3, 4 and were omitted in the drive circuit shown in FIG. 2, the drive circuit shown in FIG. 2 can operate passably. In this case, when the gate-source voltage of the transistors 1 and 2 becomes almost the threshold voltage so that the drain-source current hardly flows, the voltage $V_1$ and the output voltage Vout are stabilized. On the other hand, another problem would be encountered in that in the neighborhood of the threshold voltage, the change of the drain-source current responding to the change of the gate-source voltage is slow, and therefore, a long time is required until the voltage $V_1$ and the output voltage Vout are stabilized. In addition, the time spent until the voltage $V_1$ and the output voltage Vout are stabilized greatly depends upon the gate capacitance of the common-connected gates of the transistors 1 and 2 and the capacitance of the capacitive load connected to the output terminal $T_2$. Accordingly, in order to rapidly stabilize the voltage $V_1$ and the output voltage Vout by action of a sufficient current supplying capacity without being influenced by the gate capacitance of the transistors 1 and 2 and the capacitance of the capacitive load, it is preferred to provide the current control circuits 3, 4 and so as to control the currents flowing through the transistors 1 and 2.

As mentioned above, the drive circuit shown in FIG. 2 can ceaselessly have a high driving capacity by precharging the output terminal $T_2$, and simultaneously can realize a low power consumption by limiting the currents $I_1$, $I_2$ and $I_3$.

Now, a specific embodiment of the drive circuit shown in FIG. 2 will be described with reference to FIG. 4 which is a circuit diagram of the specific embodiment of the drive circuit shown in FIG. 2.

Figure 4:
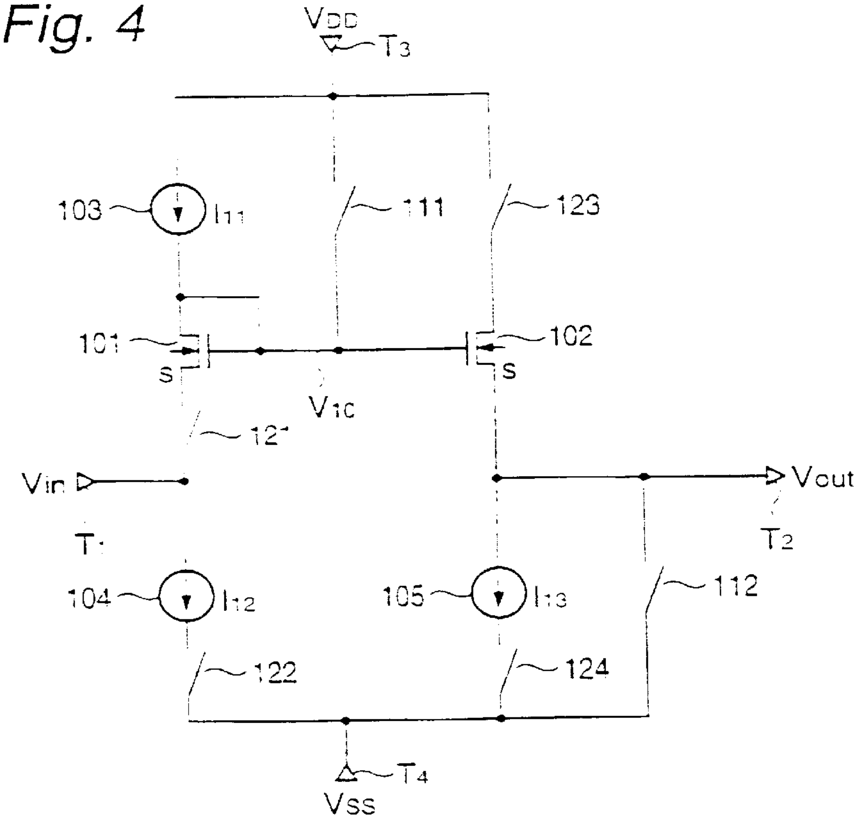
FIG. 4 is a circuit diagram of an embodiment of the drive circuit shown in FIG. 2.

In the specific drive circuit shown in FIG. 4, the transistors 1 and 2 shown in FIG. 2 are constituted of NMOS (n-channel MOS) transistors 101 and 102, respectively. The power supply voltages $E_1$ and $E_2$ are $V_{DD}$ and $V_{SS}$, respectively, where $V_{DD}>V_{SS}$. The current control circuits 3, 4 and 5 shown in FIG. 2 are respectively realized by current control circuits 103, 104 and 105, which control the currents to $I_{11}$, $I_{12}$ and $I_{13}$, respectively. The switches 11, 12, 21, 22, 23 and 24 shown in FIG. 2 are respectively realized by switches 111, 112, 121, 122, 123 and 124, which are controlled similarly to the switches 11, 12, 21, 22, 23 and 24 shown in FIG. 3. The output terminal $T_2$ is connected to a capacitive load (not shown) such as the data line. A voltage on common-connected gates of the transistors 101 and 102 is called $V_{10}$.

Figure 5A:
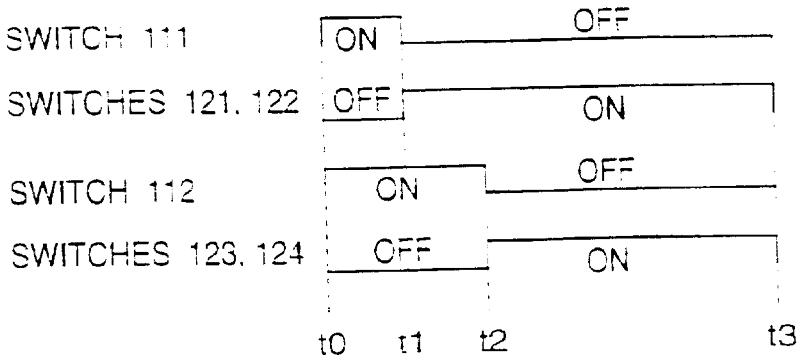
FIG. 5A is a timing chart illustrating an operation of the circuit shown in FIG. 4.
Figure 5B:
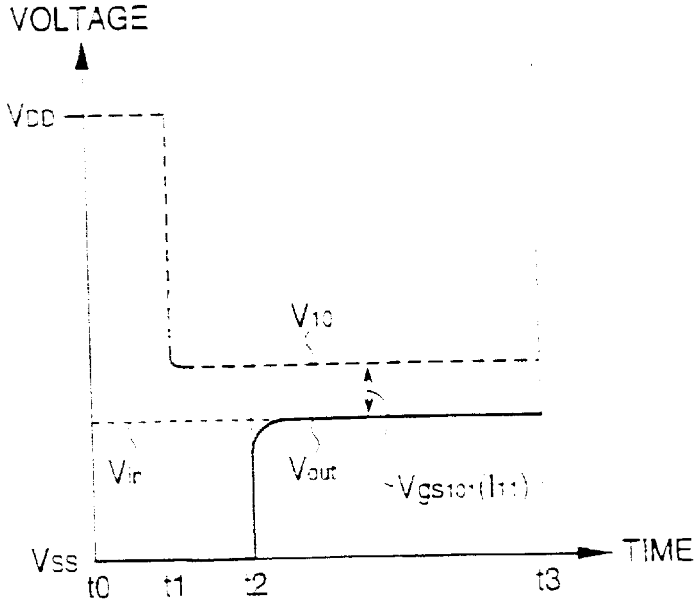
FIG. 5B is a voltage waveform diagram illustrating an operation of the circuit shown in FIG. 4.

FIG. 5A is a timing chart for controlling the switches 111, 112, 121, 122, 123 and 124 shown in FIG. 4, and FIG. 5B is a voltage waveform diagram of the input voltage Vin, the output voltage Vout and the voltage $V_{10}$ in the circuit shown in FIG. 4. One output period for outputting a selected voltage level is shown in FIGS. 5A and 5B, and a process for outputting a voltage equal to the input voltage Vin as the output voltage Vout is illustrated in FIG. 5B.

As shown in FIGS. 5A and 5B, at a time t0, the voltage $V_{10}$ is precharged to the voltage $V_{DD}$, and after a time t1, the voltage $V_{10}$ changes to a voltage deviated from the input voltage Vin by a gate-source voltage $Vgs_{101}(I_{11})$ of the transistor 101, and is stabilized as follows:

$$V_{10}=Vin+Vgs_{101}(I_{11}) \tag{6}$$

On the other hand, at the time t0, the output voltage Vout is precharged to the voltage $V_{SS}$, and after a time t2, the output voltage Vout changes to a voltage deviated from the voltage $V_{10}$ by a gate-source voltage $Vgs_{102}(I_{13})$ of the transistor 102, and is stabilized as follows:

$$Vout=V_{10}-Vgs_{102}(I_{13}) \tag{7}$$

In the above equations, $Vgs_{101}(I_{11})$ and $Vgs_{102}(I_{13})$ are positive values. If the currents $I_{11}$ and $I_{13}$ are controlled to equalize $Vgs_{101}(I_{11})$ and $Vgs_{102}(I_{13})$, the output voltage Vout becomes equal to the input voltage Vin, as seen from the equations (6) and (7). At this time, an output voltage range is expressed as follows:

$$V_{SS} \leqq Vout \leqq V_{DD} - Vgs_{102}(I_{13}) \quad (8)$$

Figure 6:
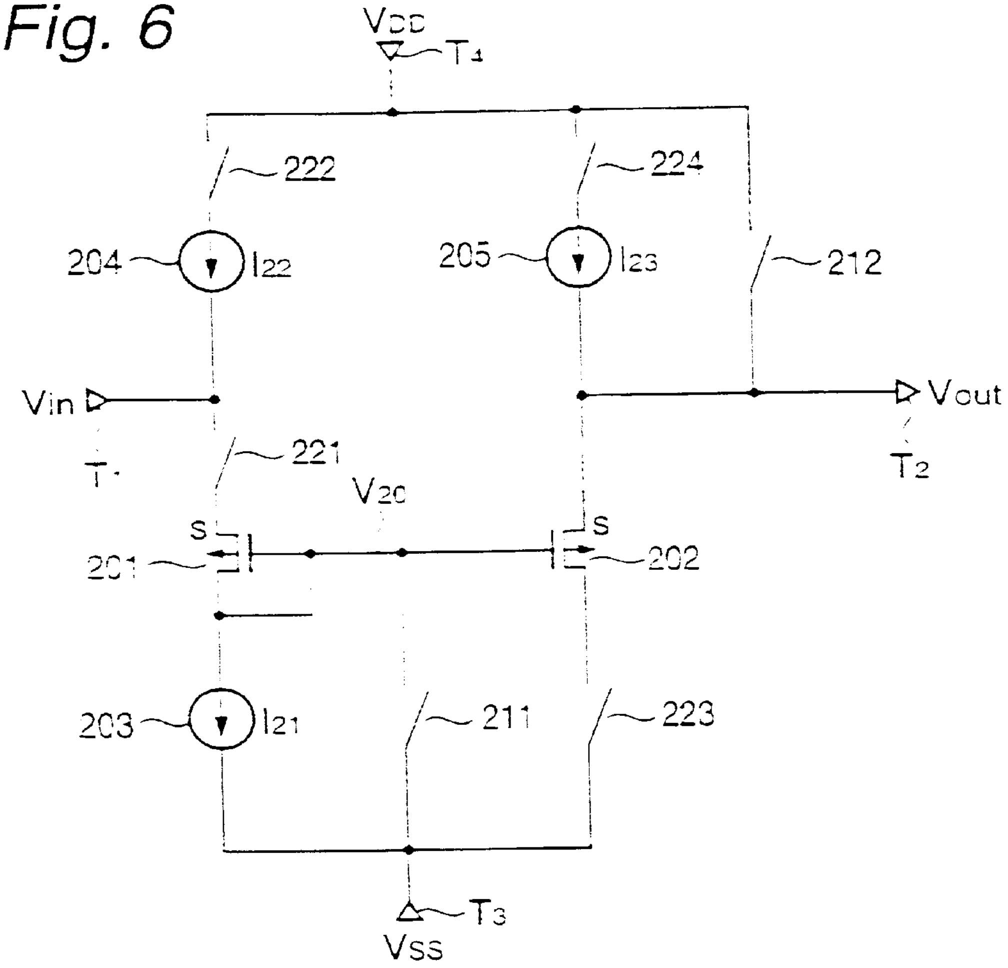
FIG. 6 is a circuit diagram of another embodiment of the drive circuit shown in FIG. 2.

FIG. 6 is a circuit diagram of another specific embodiment of the drive circuit shown in FIG. 2.

In the specific drive circuit shown in FIG. 6, the transistors 1 and 2 shown in FIG. 2 are constituted of PMOS (p-channel MOS) transistors 201 and 202, respectively. The power supply voltages $E_1$ and $E_2$ are $V_{SS}$ and $V_{DD}$, respectively, where $V_{DD}>V_{SS}$. The current control circuits 3, 4 and shown in FIG. 2 are respectively realized by current control circuits 203, 204 and 205, which control the currents to $I_{21}$, $I_{22}$ and $I_{23}$, respectively. The switches 11, 12, 21, 22, 23 and 24 shown in FIG. 2 are respectively realized by switches 211, 212, 221, 222, 223 and 224, which are controlled similarly to the switches 11, 12, 21, 22, 23 and 24 shown in FIG. 3. The output terminal $T_2$ is connected to a capacitive load (not shown) such as the data line. A voltage on common-connected gates of the transistors 201 and 202 is called $V_{20}$.

Figure 7A:
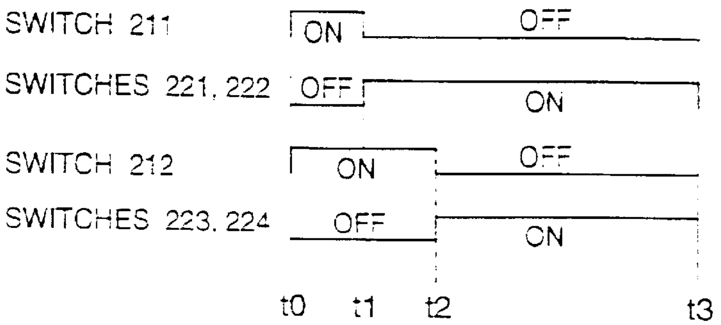
FIG. 7A is a timing chart illustrating an operation of the circuit shown in FIG. 6.
Figure 7B:
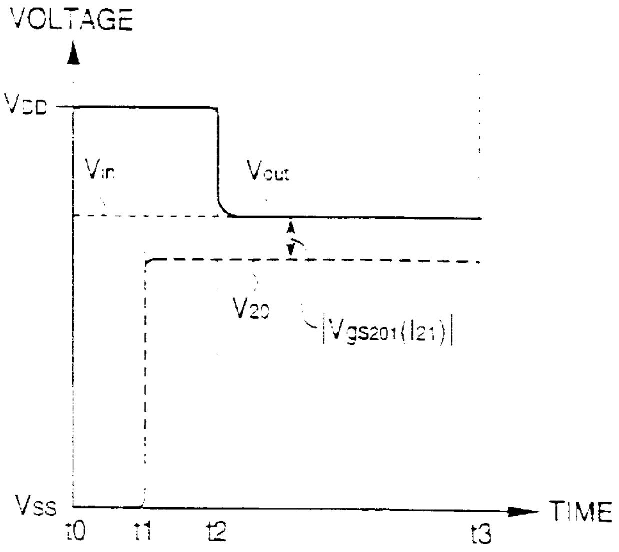
FIG. 7B is a voltage waveform diagram illustrating an operation of the circuit shown in FIG. 6.

FIG. 7A is a timing chart for controlling the switches 211, 212, 221, 222, 223 and 224 shown in FIG. 6, and FIG. 7B is a voltage waveform diagram of the input voltage Vin, the output voltage Vout and the voltage $V_{20}$ the circuit shown in FIG. 6. One output period for outputting a selected voltage level is shown in FIGS. 7A and 7B, and a process for outputting a voltage equal to the input voltage Vin as the output voltage Vout is illustrated in FIG. 7B.

As shown in FIGS. 7A and 7B, at a time t0, the voltage $V_{20}$ precharged to the voltage $V_{SS}$, and after a time t1, the voltage $V_{20}$ changes to a voltage deviated from the input voltage Vin by a gate-source voltage $Vgs_{201}(I_{21})$ of the transistor 201, and is stabilized as follows:

$$V_{20} = Vin + Vgs_{201}(I_{21}) \quad (9)$$

On the other hand, at the time t0, the output voltage Vout is precharged to the voltage $V_{DD}$, and after a time t2, the output voltage Vout changes to a voltage deviated from the input voltage $V_{20}$ by a gate-source voltage $Vgs_{202}(I_{23})$ of the transistor 202, and is stabilized as follows:

$$Vout = V_{20} - Vgs_{202}(I_{23}) \quad (10)$$

In the above equations, $Vgs_{201}(I_{21})$ and $Vgs_{202}(I_{23})$ are negative values. If the currents $I_{21}$ and $I_{23}$ are controlled to equalize $Vgs_{201}(I_{21})$ and $Vgs_{202}(I_{23})$, the output voltage Vout becomes equal to the input voltage Vin, as seen from the equations (9) and (10). At this time, an output voltage range is expressed as follows:

$$V_{SS} - Vgs_{202}(I_{23}) \leqq Vout \leqq V_{DD} \quad (11)$$

Figure 8:
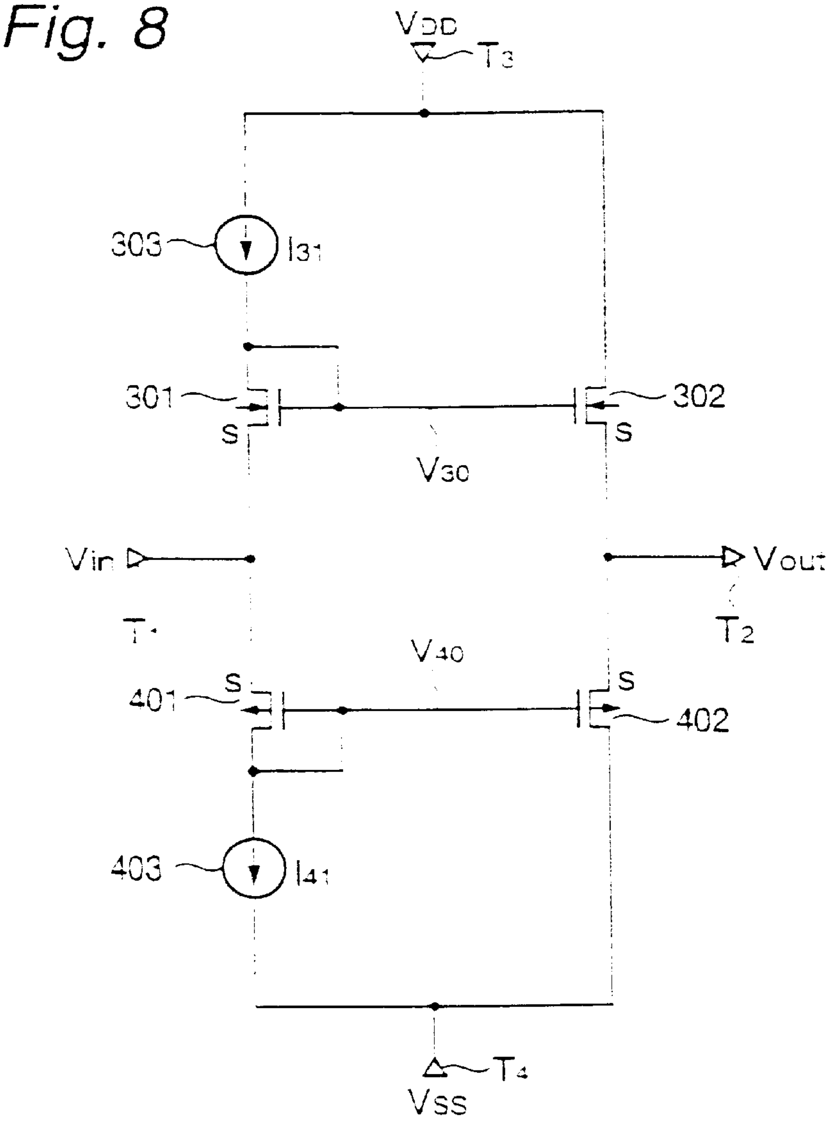
FIG. 8 is a conceptual circuit diagram of the drive circuit in accordance with a third concept of the present invention.

Referring to FIG. 8, there is shown a conceptual circuit diagram of the drive circuit in accordance with a third concept of the present invention. The shown drive circuit includes two n-channel transistors 301 and 302 having respective gates connected in common, and two p-channel transistors 401 and 402 having respective gates connected in common. The transistor 301 has a drain and the gate connected to each other, and a source connected to an input terminal $T_1$. The transistor 302 has a drain connected to a power supply terminal $T_3$ and a source connected to an output terminal $T_2$. The transistor 401 has a drain and the gate connected to each other, and a source connected to the input terminal $T_1$. The transistor 402 has a drain connected to a power supply terminal $T_4$ and a source connected to the output terminal $T_2$. A current control circuit 303 is connected between the power supply terminal $T_3$ and the drain of the transistor 301, for controlling a current $I_{31}$ which flows from the power supply terminal $T_3$ into the input terminal $T_1$. A current control circuit 403 is connected between the power supply terminal $T_4$ and the drain of the transistor 401, for controlling a current $I_{41}$ which flows from the input terminal $T_1$ into the power supply terminal $T_4$. Voltages $V_{DD}$ and $V_{SS}$ are supplied to the power supply terminals $T_3$ and $T_4$, respectively, where $V_{DD}>V_{SS}$. The output terminal $T_2$ is connected to a capacitive load (not shown) such as the data line.

Now, an operation of the drive circuit shown in FIG. 8 will be described. If an input voltage Vin is applied to the input terminal $T_1$, respective gate voltages $V_{30}$ and $V_{40}$ of the transistors 301 and 401 become a voltage deviated from the input voltage Vin by a gate-source voltage and become stable in the following condition:

$$V_{30} = Vin + Vgs_{301}(I_{31}) \quad (12)$$

$$V_{40} = Vin + Vgs_{401}(I_{41}) \quad (13)$$

On the other hand, the output voltage Vout becomes a voltage deviated from the voltages $V_{30}$ and $V_{40}$ by respective gate-source voltages of the transistors 302 and 402, and is stabilized when respective drain-source currents of the transistors 302 and 402 become equal to each other. At this time, assuming that the drain-source currents of the transistors 302 and 402 are $I_C$, the output voltage Vout becomes as follows:

$$Vout = Vin + Vgs_{301}(I_{31}) - Vgs_{302}(I_C) = Vin + Vgs_{401}(I_{41}) - Vgs_{402}(I_C) \quad (14)$$

In addition, an output voltage range becomes a voltage difference between the voltage $V_{DD}$ and the voltage $V_{SS}$, subtracted by the respective gate-source voltages of the transistors 302 and 402.

Here, if the currents 131 and 141 are equal to each other, and if the gate-source voltages $Vgs_{301}(I_{31})$ and $Vgs_{302}(I_C)$ of the transistors 301 and 302 are equal to each other and the gate-source voltages $Vgs_{401}(I_{41})$ and $Vgs_{402}(I_C)$ of the transistors 401 and 402 are equal to each other, the output voltage Vout becomes-equal to the input voltage Vin. In addition, when the currents $I_{31}$ and $I_{41}$ are equal to each other, even if an external circuit supplying the input voltage Vin is low in a current supply capacity, the drive circuit shown in FIG. 8 can be easily operated.

Now, an operation when the input voltage Vin varies, will be described. When the input voltage Vin varies, if the capacitance of the common-connected gates of the transistors 301 and 302 and the capacitance of the common-connected gates of the transistors 401 and 402 are sufficiently small, the voltages $V_{30}$ and $V_{40}$ relatively rapidly follow the change of the input voltage Vin, and changes to the voltage expressed by the equations (12) and (13). Here, if the input voltage Vin varies to approach a high voltage side ($V_{DD}$), the transistor 402 is temporarily turned off, and the output voltage Vout is rapidly pulled up by a source follower operation of the transistor 302. On the other hand, if the input voltage Vin varies to approach a low voltage side ($V_{SS}$), the transistor 302 is temporarily turned off, and the output voltage Vout is rapidly pulled down by a source follower operation of the transistor 402. In other words, regardless of whether the input voltage Vin varies to approach either the high voltage side or the low voltage side, since either the transistor 302 or the transistor 402 operates in the source follower fashion, the drive circuit shown in FIG. 8 can have a high drive capacity.

In addition, in the drive circuit shown in FIG. 8, if the size of the transistors 401 and 402 are adjusted in comparison with the transistors 301 and 302 by taking the Ids-Vgs characteristics into consideration, it is possible to adjust the current $I_C$. Accordingly, this construction in which the current between the input terminal $T_1$ and the power supply terminal $T_4$ is controlled and the current between the output terminal $T_2$ and the power supply terminal $T_4$ is controlled, can be deemed to be a modification of the drive circuit shown in FIG. 1 in the case that the transistors 1 and 2 are constituted of NMOS transistors. Similarly, in the case that the size of the transistors 301 and 302 are adjusted in comparison with the transistors 401 and 402, it is possible to adjust the current $I_c$. This case can be deemed to be a modification of the drive circuit shown in FIG. 1 in the case that the transistors 1 and 2 are constituted of PMOS transistors. Therefore, the drive circuit shown in FIG. 8 has both a performance obtained in the case that the transistors 1 and 2 in the drive circuit shown in FIG. 1 are constituted of NMOS transistors, and a performance obtained in the case that the transistors 1 and 2 in the drive circuit shown in FIG. 1 are constituted of PMOS transistors.

Figure 9:
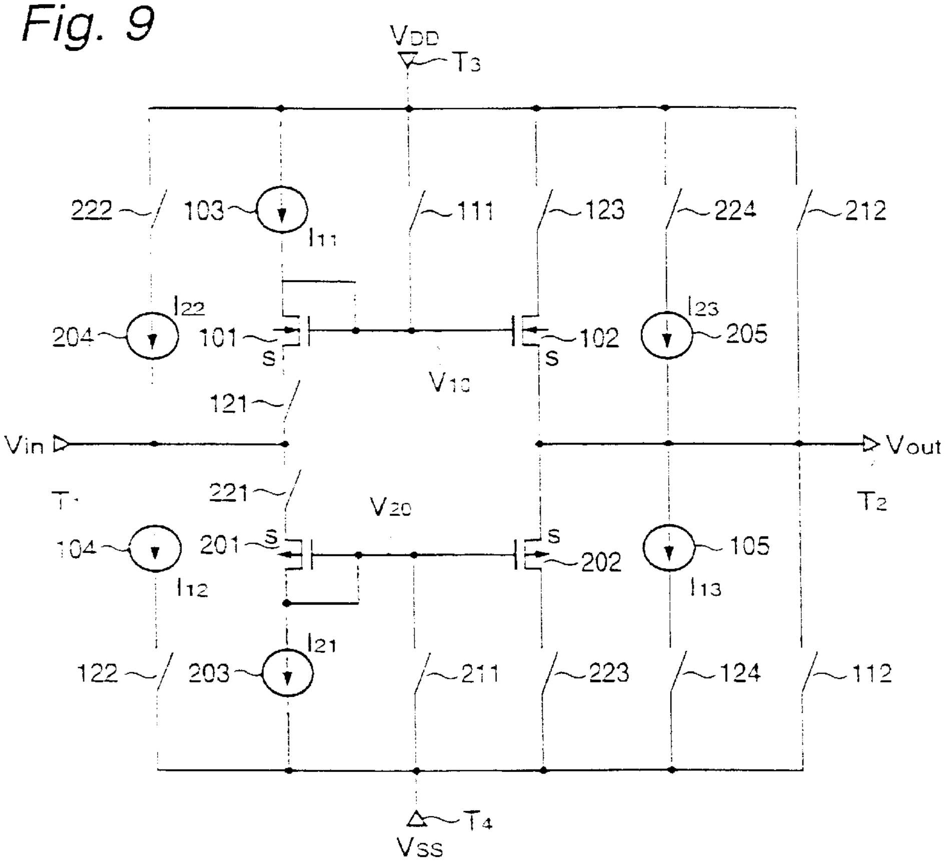
FIG. 9 is a circuit diagram of an embodiment of the drive circuit in accordance with a fourth concept of the present invention.

Referring to FIG. 9, there is shown a circuit diagram of an embodiment of the drive circuit in accordance with a fourth concept of the present invention. The drive circuit shown in FIG. 9 is one obtained by combining the drive circuit shown in FIG. 4 and the drive circuit shown in FIG. 6 in such a manner that the input terminal $T_1$ and the output terminal $T_2$ of the drive circuit shown in FIG. 4 are connected to the input terminal $T_1$ and the output terminal $T_2$ of the drive circuit shown in FIG. 6, respectively, and the power supply terminal to be supplied with the voltage $V_{DD}$ and the power supply terminal to be supplied with the voltage $V_{SS}$ in the drive circuit shown in FIG. 4 are connected to the power supply terminal to be supplied with the voltage $V_{DD}$ and the power supply terminal to be supplied with the voltage $V_{SS}$ in the drive circuit shown in FIG. 6, respectively. Therefore, in FIG. 9, elements corresponding to those shown in FIGS. 4 and 6 are given the same reference numbers and signs, and explanation will be omitted for simplification of the description. As regards the power supply terminals, however, the power supply terminal to be supplied with the voltage $V_{DD}$ is given with $T_3$, and the power supply terminal to be supplied with the voltage $V_{SS}$ is given with $T_4$. The output terminal $T_2$ is connected to a capacitive load (not shown) such as the data line.

Figure 10A:
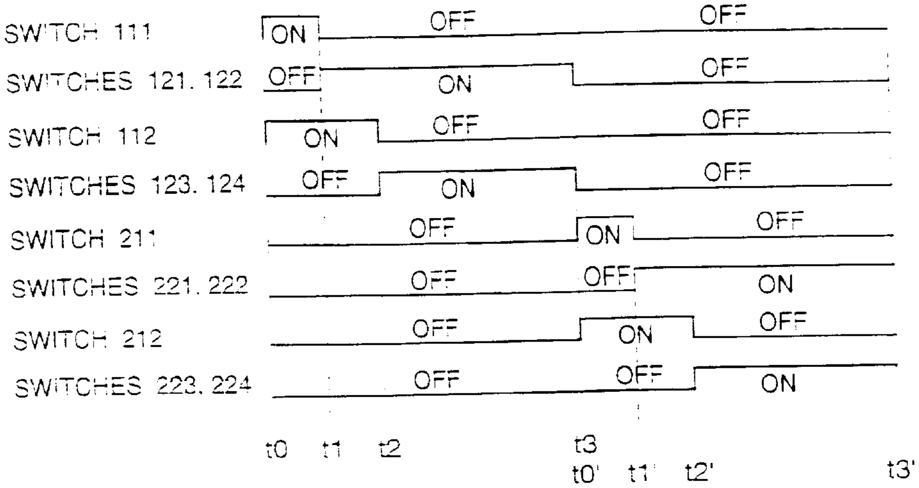
FIG. 10A is a timing chart illustrating an operation of the circuit shown in FIG. 9.
Figure 10B:
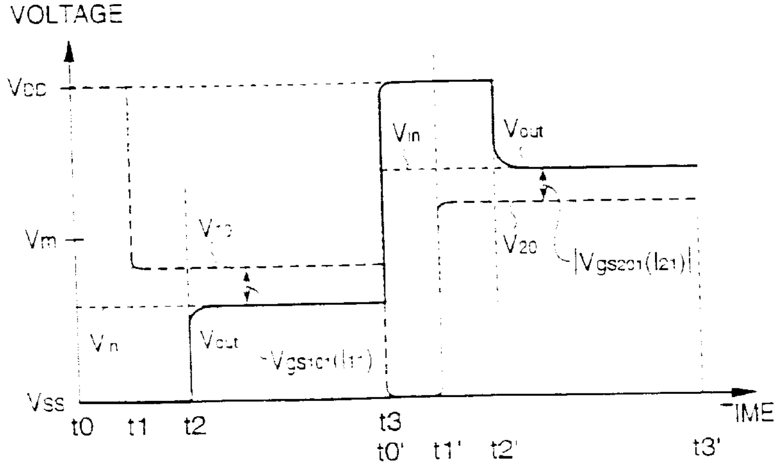
FIG. 10B is a voltage waveform diagram illustrating an operation of the circuit shown in FIG. 9.

Now, an operation of the drive circuit shown in FIG. 9 will be described with reference to FIGS. 10A and 10B. FIG. 10A is a timing chart illustrating an operation of the circuit shown in FIG. 9, during one output period (time t0 to t3) for outputting a selected voltage level of not greater than Vm, and during another output period (time t0' to t3') for outputting a selected voltage level of not less than Vm. Here, Vm is a voltage between $V_{DD}$ and $V_{SS}$. FIG. 10B is a voltage waveform diagram illustrating an operation of the circuit shown in FIG. 9, in the case that the currents $I_{11}$, $I_{13}$, $I_{21}$ and $I_{23}$ are controlled to equalize respective gate-source voltages $Vgs_{101}(I_{11})$ and $Vgs_{102}(I_{13})$ of the transistors 101 and 102 and also to equalize respective gate-source voltages $Vgs_{201}(I_{21})$ and $Vgs_{202}(I_{23})$ of the transistors 201 and 202, so that a voltage equal to the input voltage Vin is outputted as the output voltage Vout.

As shown in FIG. 10A, from a time t0 to a time t3, the switches 111, 112, 121, 122, 123 and 124 are on-off controlled, similarly to FIG. 5A, and on the other hand, the switches 211, 212, 221, 222, 223 and 224 are maintained in an off condition. Therefore, the input voltage Vin, the voltage $V_{10}$ and the output voltage Vout shown in FIG. 10B become similar to the waveform shown in FIG. 5B. From a time t0' to a time t3', the switches 211, 212, 221, 222, 223 and 224 are on-off controlled, similarly to FIG. 7A, and on the other hand, the switches 111, 112, 121, 122, 123 and 124 are maintained in an off condition. Therefore, the input voltage Vin, the voltage $V_{20}$ and the output voltage Vout shown in FIG. 10B become similar to the waveform shown in FIG. 7B.

Accordingly, the drive circuit shown in FIG. 9 is constructed to operate the drive circuit shown in FIG. 4 when a selected voltage level of not greater than Vm is to be outputted, and to operate the drive circuit shown in FIG. 6 when a selected voltage level of not less than Vm is to be outputted. Therefore, the drive circuit shown in FIG. 9 has the same driving capacity as those of the drive circuit shown in FIG. 4 and the drive circuit shown in FIG. 6.

In addition, in the case of outputting the output voltage Vout equal to the input voltage Vin, the drive circuit shown in FIG. 9 has an output voltage range, expressed by the equation (8) when the drive circuit shown in FIG. 4 operates and expressed by the equation (11) when the drive circuit shown in FIG. 6 operates. Here, if the voltage Vm is set to fulfill the following relation:

$$V_{SS}-Vgs_{202}(I_{23}) \leq Vm \leq V_{DD}-Vgs_{102}(I_{13}) \qquad (15)$$

the output voltage Vout is expressed as follows:

$$V_{SS} \leq Vout \leq V_{DD} \qquad (16)$$

Namely, the output voltage range of the drive circuit shown in FIG. 9 becomes equal to a voltage range of a power supply.

Furthermore, when the drive circuit shown in FIG. 9 outputs a selected voltage level of not greater than Vm, the output terminal $T_2$ is precharged to the voltage $V_{SS}$, and when the drive circuit shown in FIG. 9 outputs a selected voltage level of not less than Vm, the output terminal $T_2$ is precharged to the voltage $V_{DD}$. Therefore, in comparison with the drive circuits shown in FIGS. 4 and 6 in which the output terminal $T_2$ is precharged to only one of the power supply voltage $V_{SS}$ and the power supply voltage $V_{DD}$, the drive circuit shown in FIG. 9 has a small charging/discharging power for the precharging, and accordingly, can quicken the precharging.

As mentioned above, the drive circuit shown in FIG. 9 has the same driving capacity as those of the drive circuits shown in FIGS. 4 and 6, and the output voltage range equal to the voltage range of the power supply, and also can further reduce the power consumption in comparison with the drive circuits shown in FIGS. 4 and 6.

Figure 11:
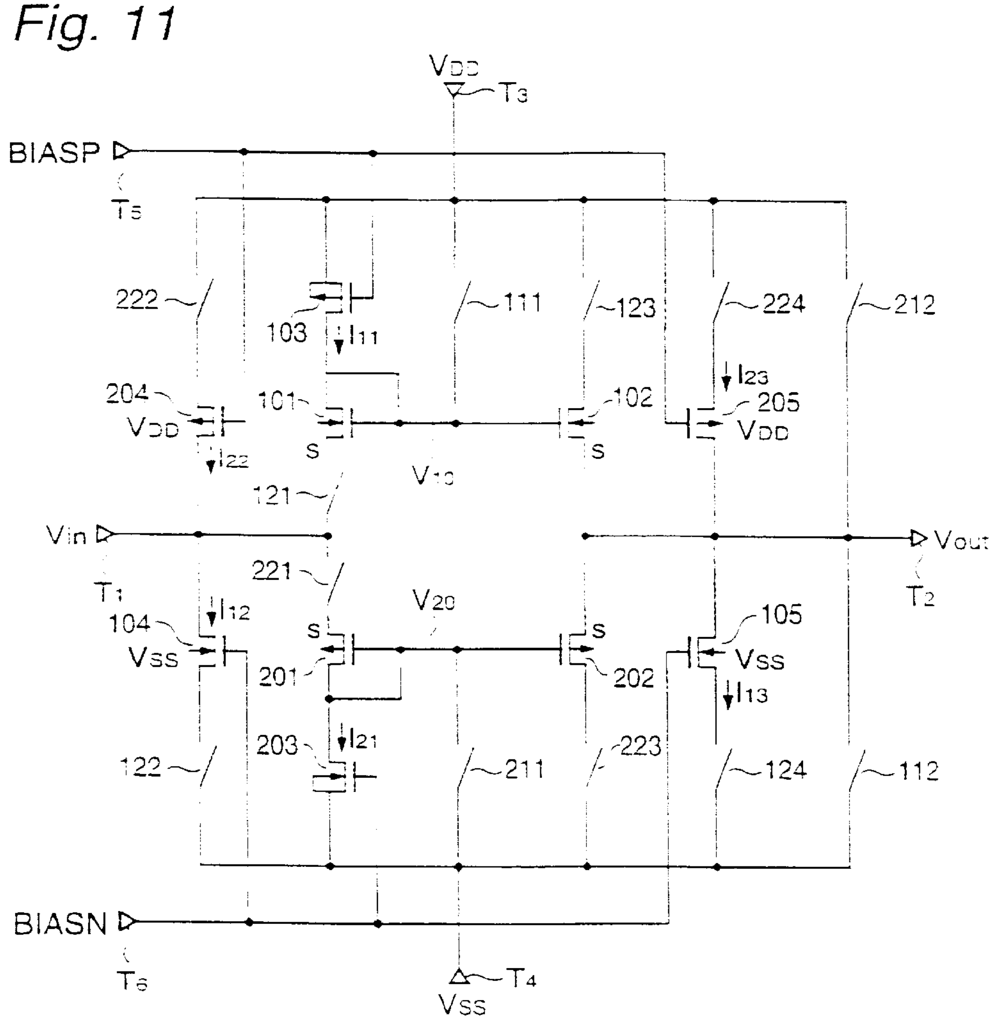
FIG. 11 is a circuit diagram of a more specific embodiment of the drive circuit shown in FIG. 9.

Referring to FIG. 11, there is shown a circuit diagram of a more specific embodiment of the drive circuit shown in FIG. 9. The drive circuit shown in FIG. 11 is so configured that, each of the current control circuits 104, 10 and 203 in the drive circuit shown in FIG. 9 is formed of an NMOS transistor, and each of the current control circuits 103, 204 and 205 in the drive circuit shown in FIG. 9 is formed of a PMOS transistor. By supplying respective predetermined voltages to gates of those current control transistors 103, 104, 105, 203, 204 and 205, the respective currents $I_{11}$, $I_{12}$, $I_{13}$, $I_{21}$, $I_{22}$ and $I_{23}$ can be controlled to desired values. The output terminal $T_2$ is connected to a capacitive load (not shown) such as the data line.

In the embodiment shown in FIG. 11, the gates of those current control transistors 104, 105 and 203 are connected to a terminal $T_6$ supplied with a bias voltage BIASN, and the gates of those current control transistors 103 and 204 and 20 are connected to a terminal $T_5$ supplied with a bias voltage BIASP. Although the gate bias voltages of a plurality of current control transistors are the same, if the size of each of the current control transistors is adjusted, each of the current control transistors can flow the current of an arbitrary value independent of that of the other current control transistors. It would be a matter of course to persons skilled in the art that it is possible to supply a different bias voltage to each of the current control transistors.

Figure 12:
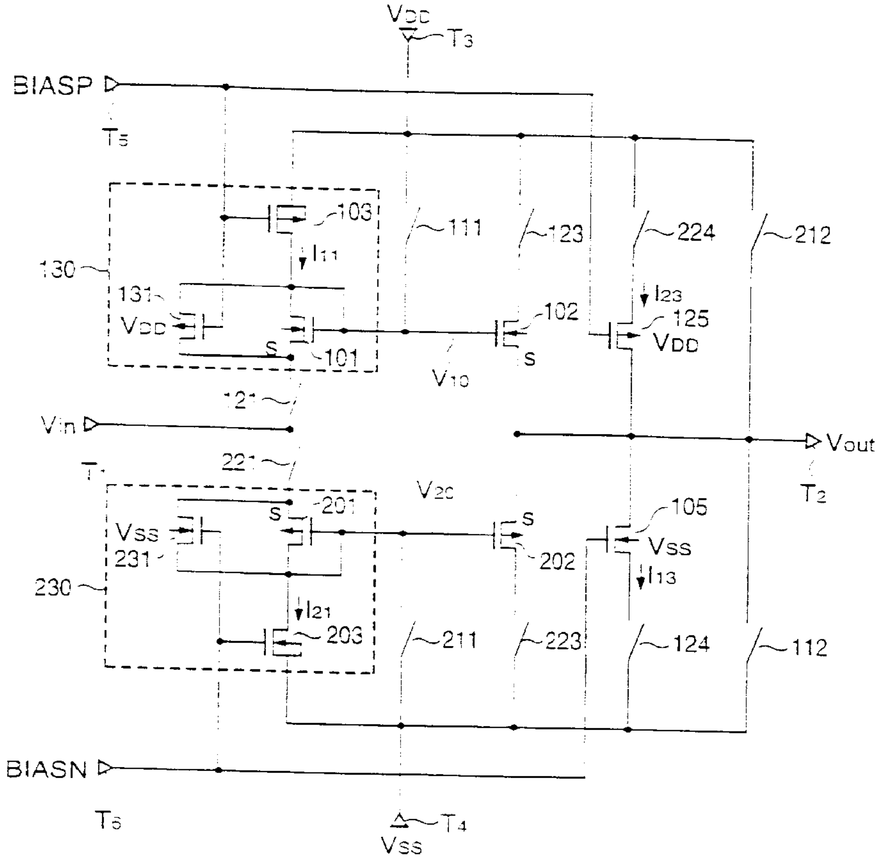
FIG. 12 is a circuit diagram of a modification of the embodiment of the drive circuit shown in FIG. 11.

FIG. 12 is a circuit diagram of a modification of the embodiment of the drive circuit shown in FIG. 11. The drive circuit shown in FIG. 12 is improved to be constituted of circuit elements of the number smaller than that of the circuit elements included in the drive circuit shown in FIG. 11 so that the number of the kinds of switch control signals is reduced in comparison with the drive circuit shown in FIG. 11.

The drive circuit shown in FIG. 12 is different from the drive circuit shown in FIG. 11 in that the current control circuits 104 and 204 and the switches 122 and 222 included in the drive circuit shown in FIG. 11 are omitted, and a PMOS transistor 131 and an NMOS transistor 231 are newly added. The PMOS transistor 131 includes a source and a drain connected to the drain (gate) and the source of the NMOS transistor 101, respectively, and a gate connected to the terminal $T_5$ supplied with the voltage BIASP. The NMOS transistor 231 includes a source and a drain connected to the drain (gate) and the source of the PMOS transistor 201, respectively, and a gate connected to the terminal $T_6$ supplied with the voltage BIASN. The PMOS transistor 131 has a threshold voltage smaller than that of the PMOS transistor 103, so that the same gate voltage is applied to the PMOS transistors 103 and 131, the PMOS transistor 131 has a current supplying capacity sufficiently larger than that of the PMOS transistor 103. The NMOS transistor 231 has a threshold voltage smaller than that of the NMOS transistor 203, so that the same gate voltage is applied to the NMOS transistors 203 and 231, the NMOS transistor 231 has a current supplying capacity sufficiently larger than that of the NMOS transistor 203. Here, a circuit constituted of the NMOS transistor 101 and the PMOS transistors 103 and 131 is called a circuit block 130, and a circuit constituted of the PMOS transistor 201 and the NMOS transistors 203 and 231 is called a circuit block 230. The output terminal $T_2$ is connected to a capacitive load (not shown) such as the data line.

Figure 13A:
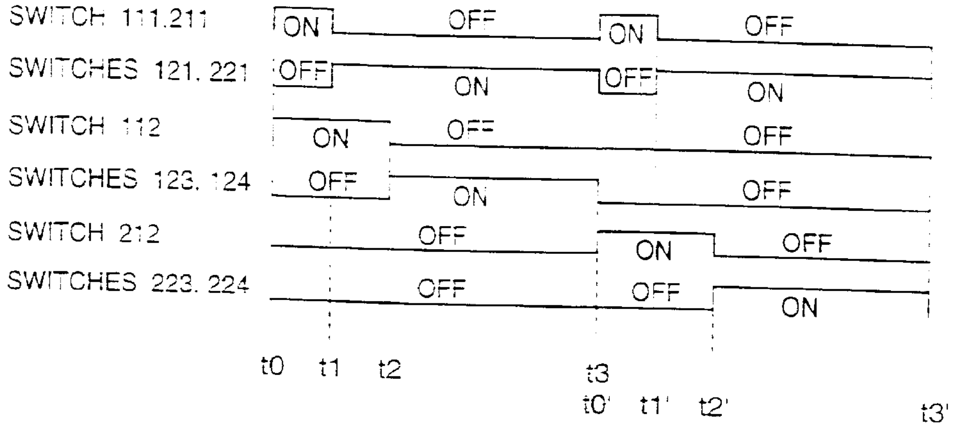
FIG. 13A is a timing chart illustrating an operation of the circuit shown in FIG. 12.
Figure 13B:
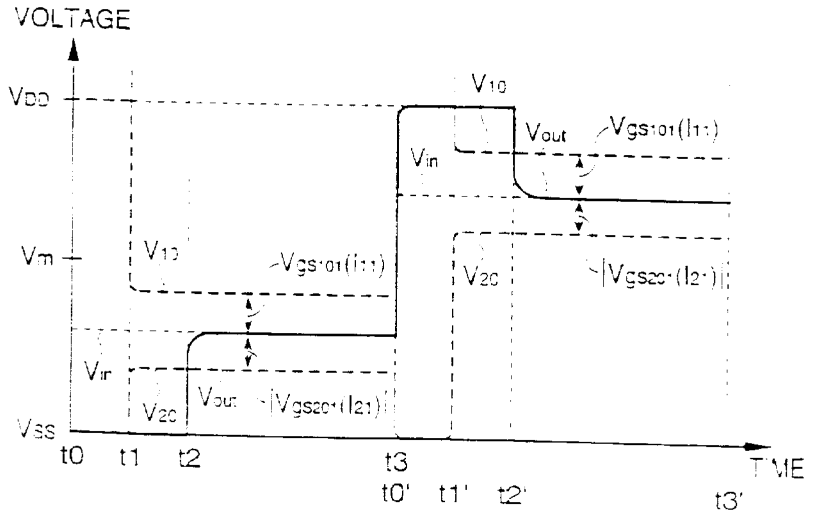
FIG. 13B is a voltage waveform diagram illustrating an operation of the circuit shown in FIG. 12.

Now, an operation of the drive circuit shown in FIG. 12 will be described with reference to FIGS. 13A and 13B. FIG. 13A is a timing chart illustrating an operation of the circuit shown in FIG. 12, during one output period (time t0 to t3) for outputting a selected voltage level of not greater than Vm, and during another output period (time t0' to t3') for outputting a selected voltage. level of not less than Vm. FIG. 13B is a voltage waveform diagram illustrating an operation of the circuit shown in FIG. 12, in the case of outputting the output voltage Vout equal to the input voltage Vin. As seen from FIG. 13A, on-off timings of the switches 112, 123, 124, 212, 223 and 224 are the same as those shown in FIG. 10A.

In brief, the drive circuit shown in FIG. 12 is featured in that, from a time t0 to a time t3, the circuit block 230 and the switch 221 exercise the same function as that realized in the current control circuit 104 and the switch 122 of the drive circuit shown in FIG. 11, and from a time t0' to a time t3', the circuit block 130 and the switch 121 exercise the same function as that realized in the current control circuit 204 and the switch 222 of the drive circuit shown in FIG. 11. In the following, the operation of the drive circuit shown in FIG. 12 will be described.

During one output period (time t0 to t3) for outputting a selected voltage level of not greater than Vm, at a time t0, the switches 111 and 211 are turned on, and the switches 121 and 221 are turned off. As a result, the common-connected gates of the transistors 101 and 102 are precharged to the voltage $V_{DD}$, and the common-connected gates of the transistors 201 and 202 are precharged to the voltage $V_{SS}$. In addition, the switch 112 is turned on and the switches 123 and 124 are turned off, so that the output terminal $T_2$ is precharged to the voltage $V_{SS}$. On the other hand, the switches 212, 223 and 224 are maintained in an off condition during the period of the time t0 to the time t3.

At a time t1, the switches 111 and 211 are turned off, and the switches 121 and 221 are turned on. As a result, by action of the transistors 101 and 201, the voltage $V_{10}$ at the common-connected gates of the transistors 101 and 102 and the voltage $V_{20}$ at the common-connected gates of the transistors 201 and 202 respectively rapidly change to voltages which are deviated from the input voltage Vin by the gate-source voltage of the respective transistor, and become stable at the voltages expressed by the following equations (16) and (17):

$$V_{10}=Vin+Vgs_{101}(I_{11}) \tag{16}$$

$$V_{20}=Vin+Vgs_{201}(I_{21}) \tag{17}$$

At this time, the transistors 131 and 231 are brought into the off condition. Thus, the current $I_{11}$ flows between the power supply terminal $T_3$ and the input terminal $T_1$, and the current $I_{21}$ flows between the input terminal $T_1$ and the power supply terminal $T_4$.

At a time t2, the switch 112 is turned off, and the switches 123 and 124 are turned on. As a result, by the source follower operation of the transistor 102, the output voltage Vout rapidly changes to a voltage which is deviated from the voltage $V_{10}$ by the gate-source voltage of the transistor 102, and is stabilized at the voltage expressed by the following equation (18) until a time t3.

$$Vout=V_{10}-Vgs_{102}(I_{13}) \tag{18}$$

Here, if the currents $I_{11}$ and $I_{13}$ are controlled to equalize $Vgs_{101}(I_{11})$ and $Vgs_{102}(I_{13})$ of the transistors 101 and 102, the output voltage Vout becomes equal to the input voltage Vin.

During another output period (time t0' to t3') for outputting a selected voltage level of not less than Vm, at a time t0', the switches 111 and 211 are turned on, and the switches 121 and 221 are turned off. As a result, the common-connected gates of the transistors 101 and 102 are precharged to the voltage $V_{DD}$, and the common-connected gates of the transistors 201 and 202 are precharged to the voltage $V_{SS}$. In addition, the switch 212 is turned on and the switches 223 and 224 are turned off, so that the output terminal $T_2$ is precharged to the voltage $V_{DD}$. On the other hand, the switches 112, 123 and 124 are maintained in the off condition during the period of the time t0' to the time t3'.

At a time t1', the switches 111 and 211 are turned off, and the switches 121 and 221 are turned on. As a result, by action of the transistors 101 and 201, the voltage $V_{20}$ at the common-connected gates of the transistors 101 and 102 and the voltage $V_{10}$ at the common-connected gates of the transistors 201 and 202 respectively rapidly change to the voltages which are deviated from the input voltage Vin by the gate-source voltage of the respective, transistor, and become stable at the voltages expressed by the equations (16) and (17). At this time, the transistors 131 and 231 are brought into the off condition. Thus, the current $I_{11}$ flows between the power supply terminal $T_3$ and the input terminal $T_1$, and the current $I_{21}$ flows between the input terminal $T_1$ and the power supply terminal $T_4$.

At a time t2', the switch 212 is turned off, and the switches 223 and 224 are turned on. As a result, by the source follower operation of the transistor 202, the output voltage Vout rapidly changes to a voltage which is deviated from the voltage $V_{20}$ by the gate-source voltage of the transistor 202, and is stabilized at the voltage expressed by the following equation (19) until a time t3'.

$$Vout=V_{20}-Vgs_{202}(I_{23}) \quad (19)$$

Here, if the currents $I_{21}$ and $I_{23}$ are controlled to equalize $Vgs_{201}(I_{21})$ and $Vgs_{202}(I_{23})$ of the transistors 201 and 202, the output voltage Vout becomes equal to the input voltage Vin.

Furthermore, if the current $I_{11}$ and the current $I_{21}$ are equal to each other, even if an external circuit supplying the input voltage Vin is low in a current supply capacity, the drive circuit shown in FIG. 12 can be easily operated.

The above mentioned operation is in the case that the input voltage Vin is higher than the voltage $V_{SS}$ at some degree and lower than the voltage $V_{DD}$ at some degree so that the both of the transistors 101 and 201 are turned on. Next, an operation will be described in the case that the input voltage Vin is near to either the voltage $V_{SS}$ or the voltage $V_{DD}$ so that either the transistor 101 or the transistor 201 remains off.

When the input voltage Vin is at a level near to the voltage $V_{SS}$ during the period from the time t1 to the time t3, at a time t1, the voltage. $V_{10}$ becomes the voltage expressed by the equation (16), but the voltage $V_{20}$ does not become the voltage expressed by the equation (17). The reason for this is that if the gate-source voltage of the transistor 201 is smaller than the threshold voltage of the transistor 201 because the input voltage Vin is near to the voltage $V_{SS}$, the transistor 201 remains off. Just after the time t1, the voltage $V_{20}$ is at the voltage $V_{SS}$ which was precharged during the period from the time t0 to the time t1, but since the current is supplied from the input terminal $T_1$ to the drain of the transistor 203 by action of the transistor 231, the voltage $V_{20}$ is pulled up to an intermediate voltage between the input voltage Vin and the voltage $V_{SS}$. At this time, if the current supplying capacity of the transistor 231 is larger than that of the transistor 203, the current flowing from the input terminal $T_1$ to the power supply terminal $T_4$ becomes the current $I_{21}$ controlled by the current control transistor 203. Accordingly, even if the input voltage Vin is near to the voltage $V_{SS}$ so that the transistor 201 remains off, it is possible to supply the current $I_{21}$ between the input terminal $T_1$ and the power supply terminal $T_4$.

On the other hand, when the input voltage Vin is at a level near to the voltage $V_{DD}$ during the period from the time t1' to the time t3', at a time t1', the voltage $V_{20}$ becomes the voltage expressed by the equation (17), but the voltage $V_{10}$ does not become the voltage expressed by the equation (16). The reason for this is that if the gate-source voltage of the transistor 101 is smaller than the threshold voltage of the transistor 101 because the input voltage Vin is near to the voltage $V_{DD}$, the transistor 101 remains off. Just after the time t1', the voltage $V_{10}$ is at the voltage $V_{DD}$ which was precharged during the period from the time t0' to the time t1, but since the current is supplied from the drain of the transistor 103 to the input terminal $T_1$ by action of the transistor 131, the voltage $V_{10}$ is pulled down to an intermediate voltage between the input voltage Vin and the voltage $V_{DD}$. At this time, if the current supplying capacity of the transistor 131 is larger than that of the transistor 103, the current flowing from the power supply terminal $T_3$ to the input terminal $T_1$ becomes the current $I_{11}$ controlled by the current control transistor 103. Accordingly, even if the input voltage Vin is near to the voltage $V_{DD}$ so that the transistor 101 remains off, it is possible to supply the current $I_{11}$ between the power supply terminal $T_3$ and the input terminal $T_1$.

As seen from the above, the circuit blocks 130 and 230 can flow the currents $I_{11}$ and $I_{21}$, respectively, independently of the voltage level of the input voltage Vin, and also have the function of the current control circuit.

Thus, in the drive circuit shown in FIG. 12, during the period from the time t1 to the time t3, the switch 221 and the circuit block 230 exercise the same function as that achieved by the switch 122 and the current control circuit 104 of the drive circuit shown in FIG. 11, and during the period from the time t1' to the time t3', the switch 121 and the circuit block 130 exercise the same function as that achieved by the switch 222 and the current control circuit 204 of the drive circuit shown in FIG. 11. Accordingly, the overall basic operation of the drive circuit shown in FIG. 12 is completely the same as that of the drive circuit shown in FIG. 11, and the performance of the drive circuit shown in FIG. 12 is substantially equal to that of the drive circuit shown in FIG. 11.

Figure 14A:
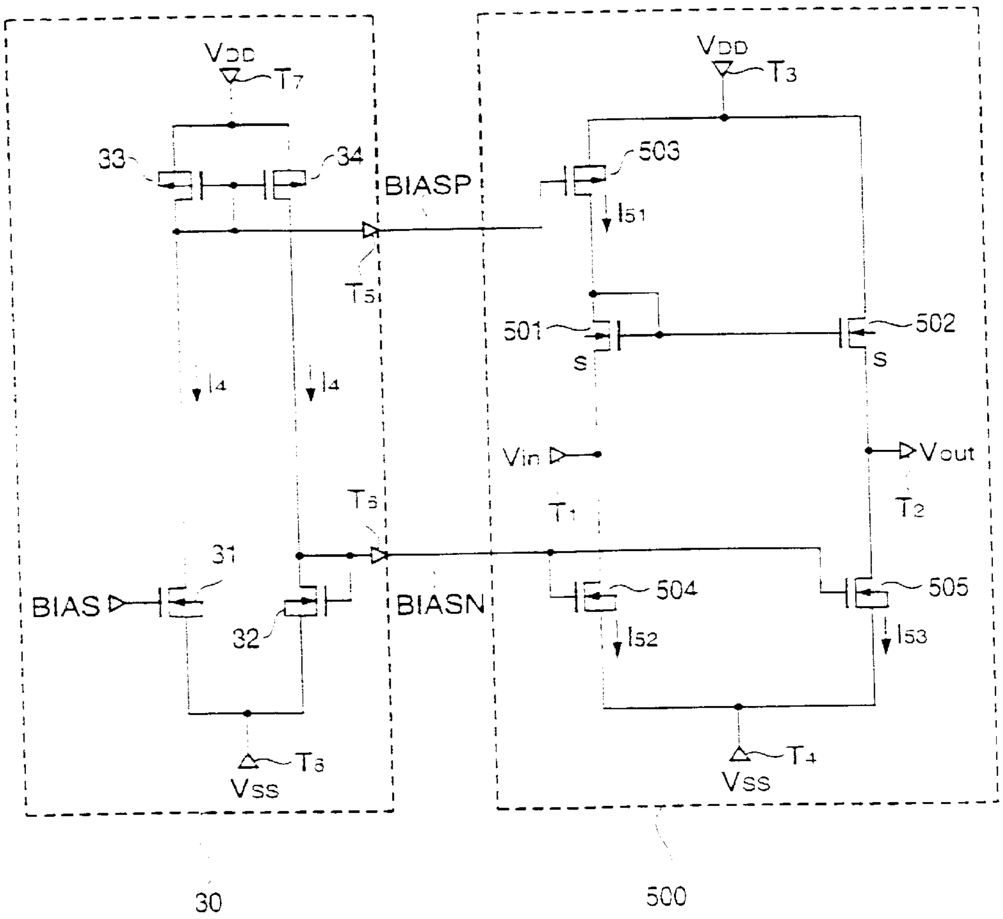
FIG. 14A is a circuit diagram for illustrating one example of the current control circuit associated with the drive circuit in accordance with the present invention.
Figure 14B:
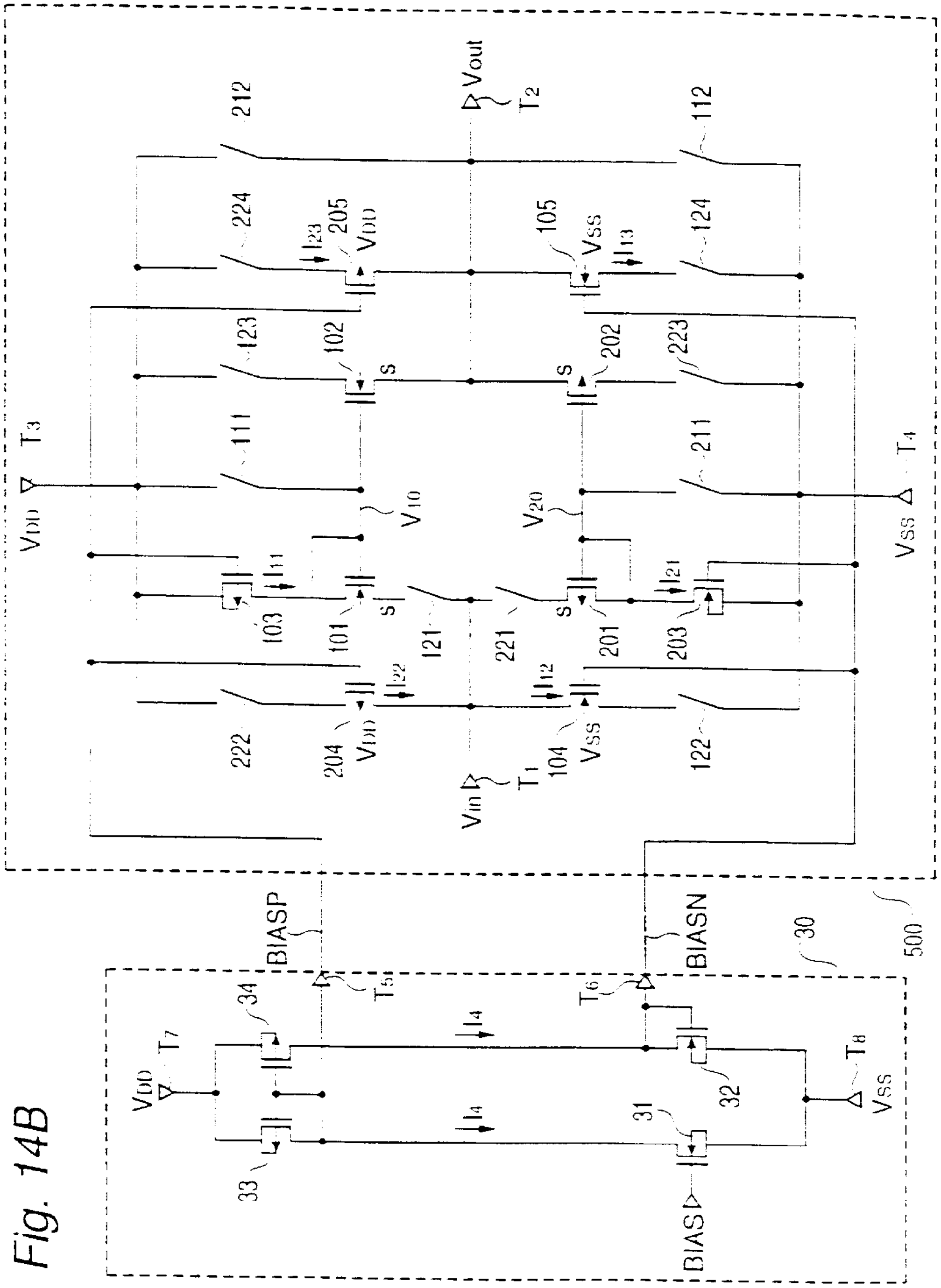
FIGS. 14B and 14C are circuit diagrams of modifications of the circuit shown in FIG. 14A, in which the driving circuit is replaced with the driving circuits shown in FIGS. 11 and 12, respectively.
Figure 14C:
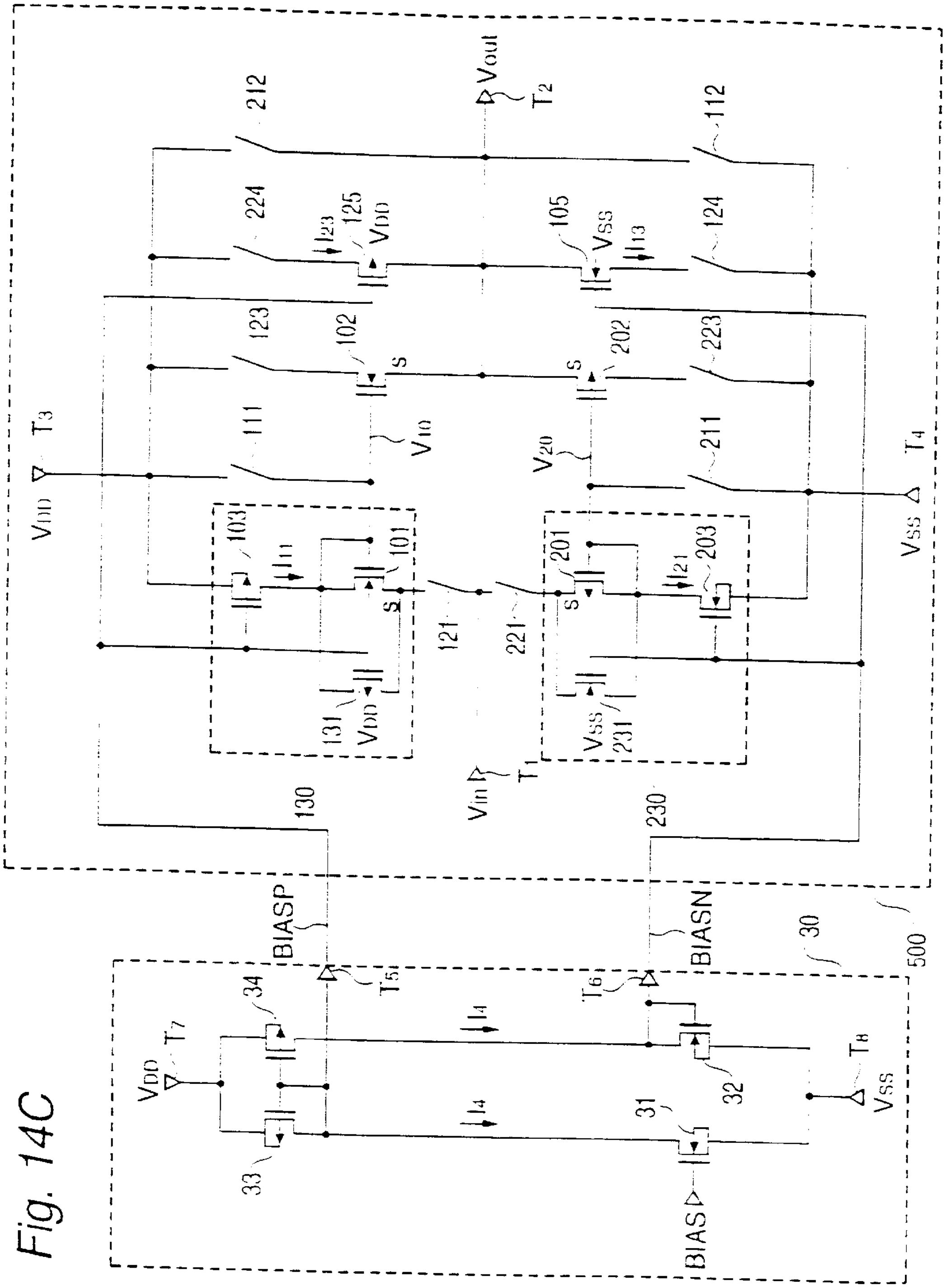
Figure 14D:
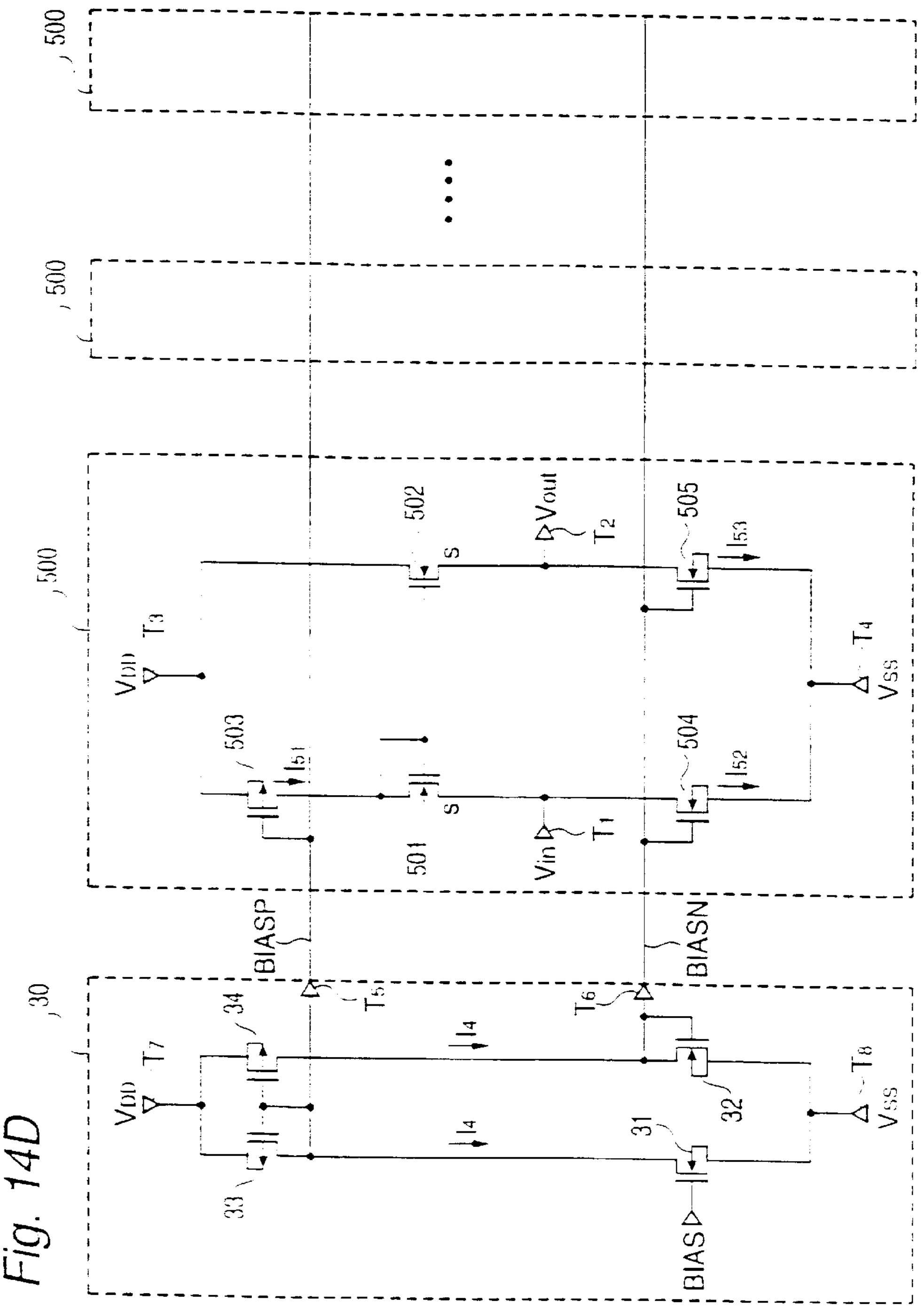
FIGS. 14D, 14E and 14F are circuit diagrams for illustrating examples in which one bias circuit shown in FIG. 14A is connected in common to a plurality of drive circuits.
Figure 14E:
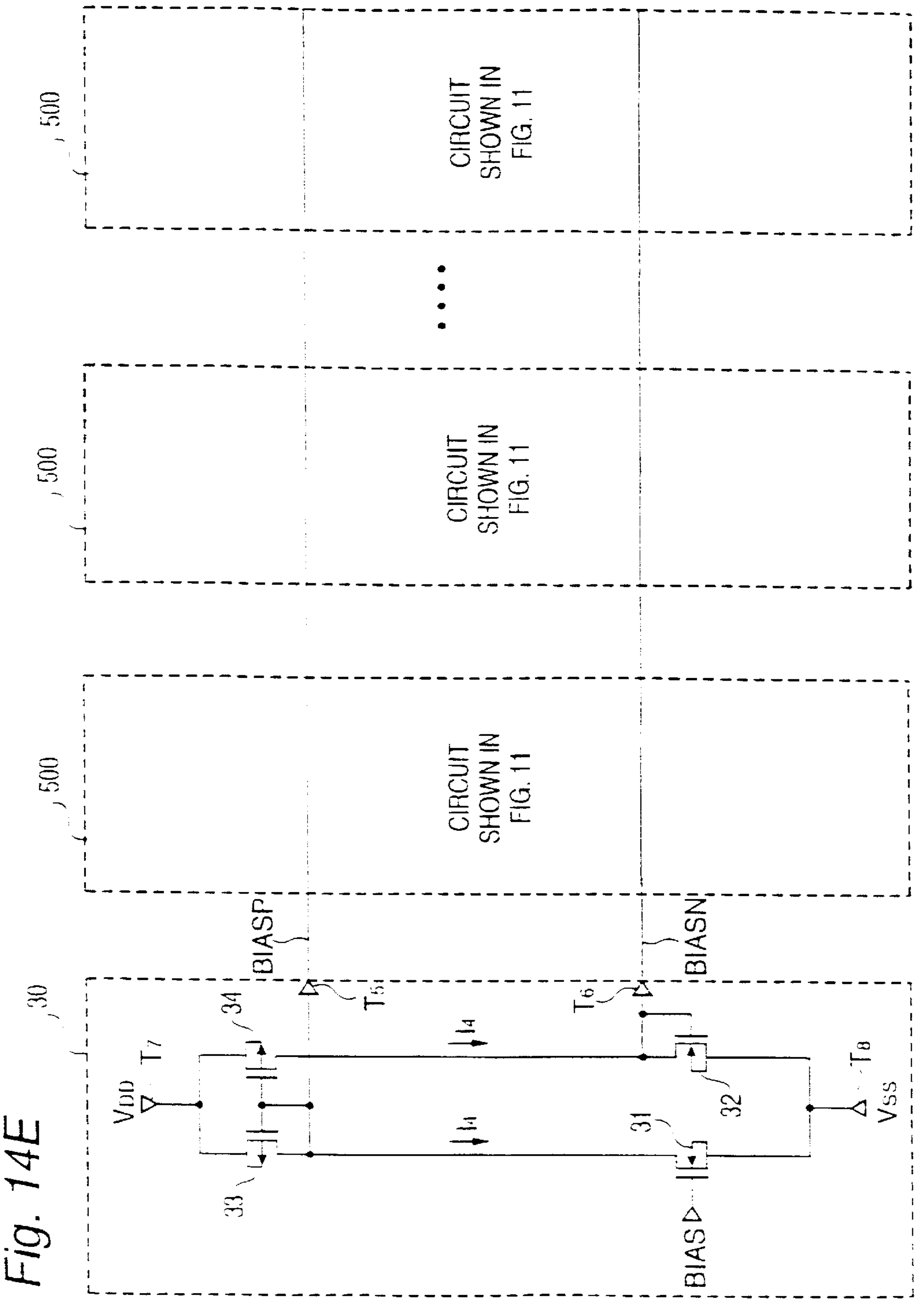
Figure 14F:
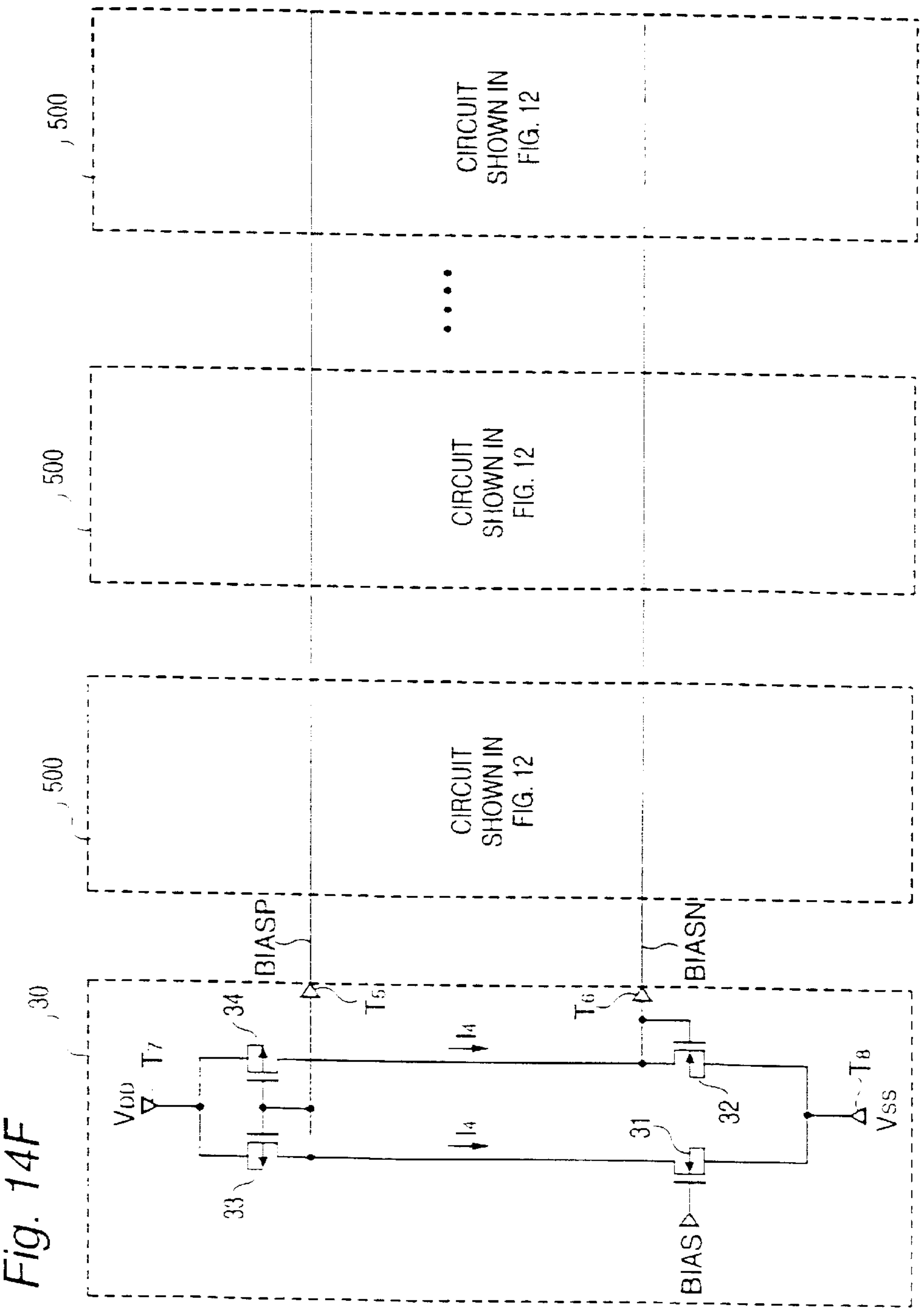

Referring to FIG. 14A, there is shown a circuit diagram of one example of the current control circuit associated with the drive circuit in accordance with the present invention. In FIG. 14A, a circuit block 500 is the drive circuit in accordance with the present invention in which each current control circuit is constituted of a single current control transistor, and a circuit block 30 is a bias circuit for precisely controlling the current control transistor.

In brief, the circuit block 500 is the drive circuit shown in FIG. 1 in which the transistors 1 and 2 are formed of NMOS transistors 501 and 502, respectively, and the current control circuits 3, 4 and are formed of a PMOS transistor 503 and NMOS transistors 504 and 505, respectively. A gate of the PMOS transistor 503 is connected to a terminal $T_5$ of the circuit block 30, and respective gates of the NMOS transistors 504 and 50 are connected in common to a terminal $T_6$ of the circuit block 30. The power supply terminals $T_3$ and $T_4$ are supplied with the power supply voltages $V_{DD}$ and $V_{SS}$, respectively. The output terminal $T_2$ is connected to a capacitive load (not shown) such as the data line.

The circuit block 30 is the bias circuit for supplying bias voltages to the respective gates of the transistors 503, 504 and 50 which functions as the current control circuits. This bias circuit 30 includes NMOS transistors 31 and 32 and PMOS transistors 33 and 34, as shown. The PMOS transistors 33 and 34 have the same Ids-Vgs characteristics. The NMOS transistor 31 has a drain connected to the terminal $T_5$, a source connected to a power supply terminal $T_8$ and a gate connected to receive an external bias voltage BIAS. The NMOS transistor 32 has a drain and a gate connected in common to the terminal $T_6$, and a source connected to the power supply terminal $T_8$. The PMOS transistor 33 has a drain and a gate connected in common to the terminal $T_5$, and a source connected to a power supply terminal $T_7$. The PMOS transistor 34 has a drain connected to the terminal $T_6$, a source connected to the power supply terminal $T_7$ and a gate connected to the terminal $T_5$. Since the PMOS transistors 33 and 34 have the same Ids-Vgs characteristics and the respective gates connected in common, respective drain-source currents of the PMOS transistors 33 and 34 are equal. Here, the drain-source currents of the PMOS transistors 33 and 34 are called an $I_4$. This current $I_4$ is controlled by the external bias voltage BIAS, and respective voltages BIASP and BIASN at the terminals $T_5$ and $T_6$ are controlled by the current $I_4$. The power supply terminals $T_7$ and $T_8$ are supplied with the power supply voltages $V_{DD}$ and $V_{SS}$, respectively.

Here, if the device sizes of the PMOS transistors 33, 34 and 503 and the NMOS transistors 32 and 504 are designed by considering a characteristics variation of transistors and the currents $I_4$, $I_{51}$ and $I_{52}$ are set to equalize the currents $I_{51}$ and $I_{52}$, even if the characteristics of transistors varies, the drive circuit can be made independent of a current supplying capacity of an external circuit supplying the input voltage Vin. Furthermore, if the device sizes of the PMOS transistors 33, 34 and 503 and the NMOS transistors 32 and 50 are designed by considering a characteristics variation of transistors and the currents $I_4$, $I_{51}$ and $I_{53}$ are set to equalize respective gate-source voltages of the transistors 501 and 502, even if the characteristics of transistors varies, it is possible to supply the output voltage Vout equal to the input voltage Vin.

In the simplest way, it is designed that the transistors 501 and 502 have the same device size, the PMOS transistors 33, 34 and 503 have the same device size, and the NMOS transistors 32, 504 and 50 have the same device size. In this case, the currents $I_4$, $I_{51}$, $I_{52}$ and $I_{53}$ are equal, and even if the characteristics of transistors varies, the relation among the currents $I_4$, $I_{51}$, $I_{52}$ and $I_{53}$ is maintained. Accordingly, the drive circuit can output the output voltage Vout equal to the input voltage Vin, independently of a current supplying capacity of an external circuit supplying the input voltage Vin.

As mentioned above, if the bias circuit 30 is associated to the drive circuit 500 in which the current control circuits are constituted of transistors, the drive circuit 500 is made independent of a current supplying capacity of an external circuit supplying the input voltage Vin, and the drive circuit 500 can output a highly precise voltage, independently of characteristics variation of transistors attributable to a device fabricating process and a temperature variation.

Figure 15A:
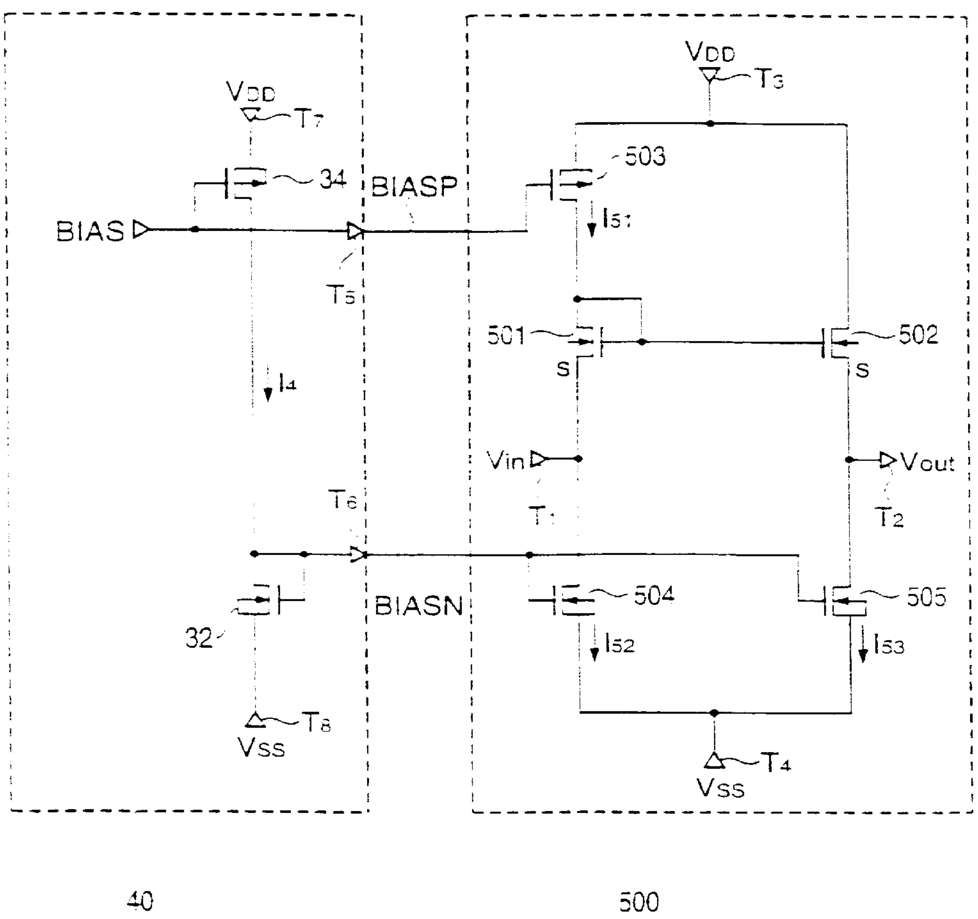
FIG. 15A is a circuit diagram for illustrating a modification of the current control circuit shown in FIG. 14.
Figure 15B:
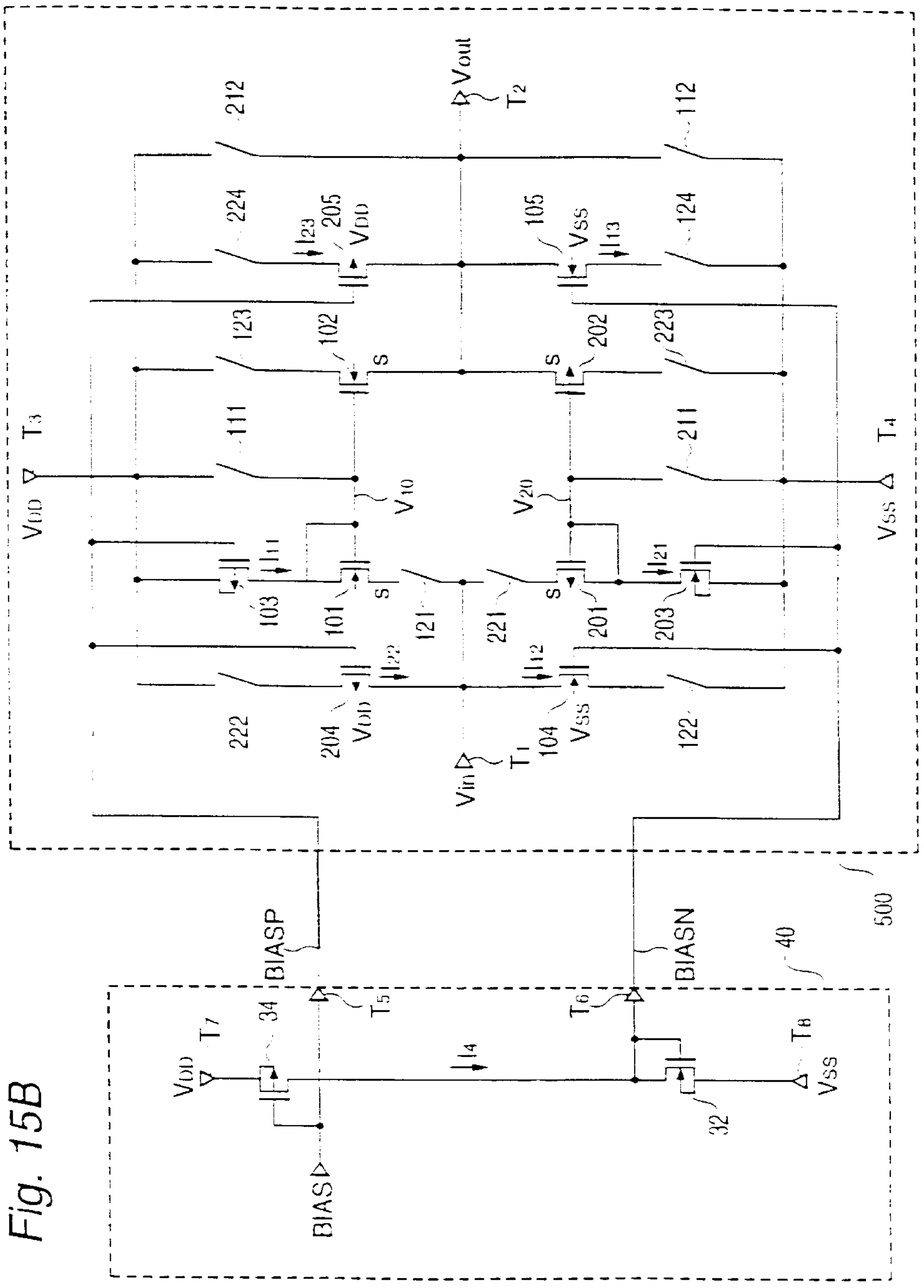
FIGS. 15B and 15C are circuit diagrams of modifications of the circuit shown in FIG. 15A, in which the driving circuit is replaced with the driving circuits shown in FIGS. 11 and 12, respectively.
Figure 15C:
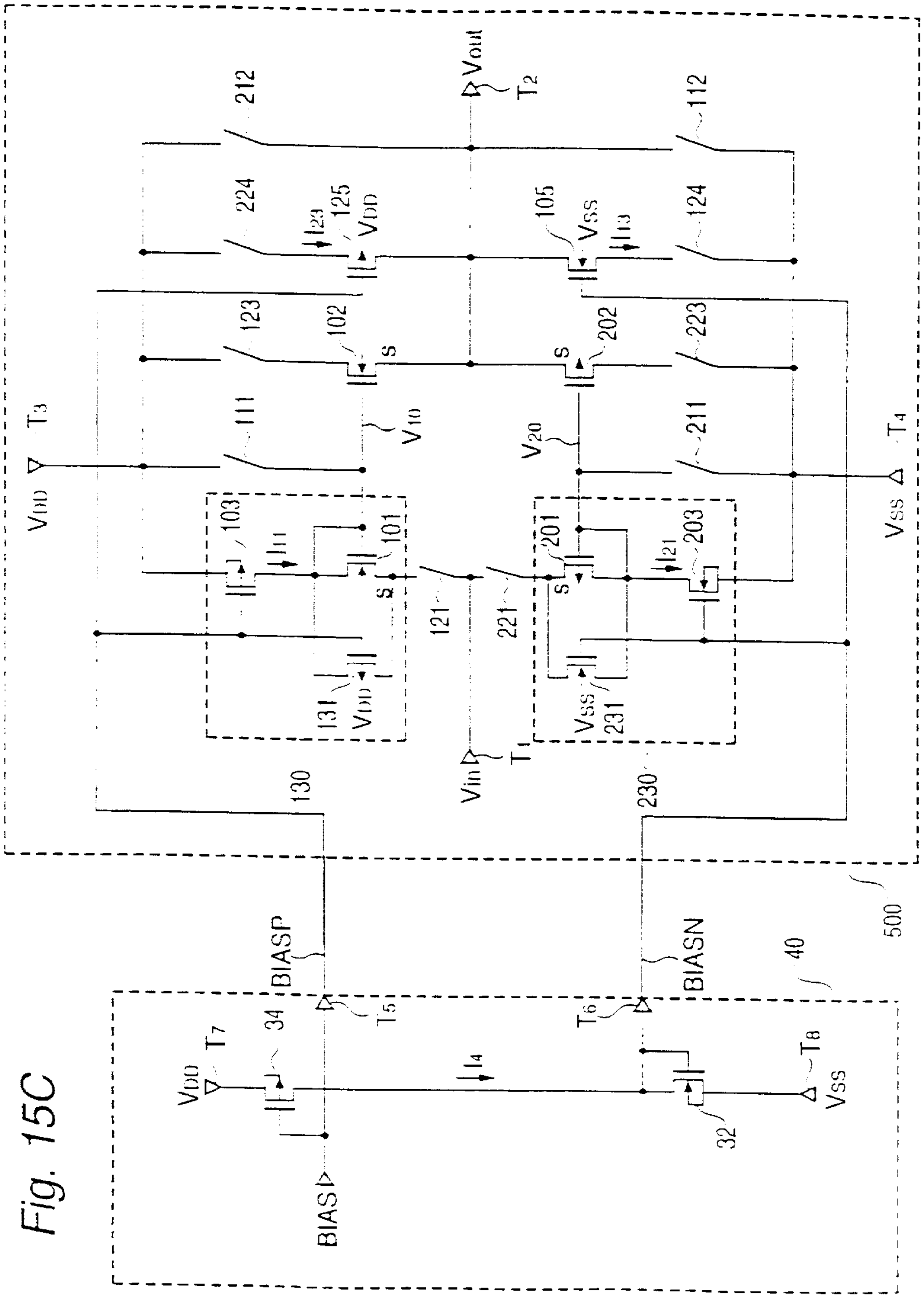
Figure 15D:
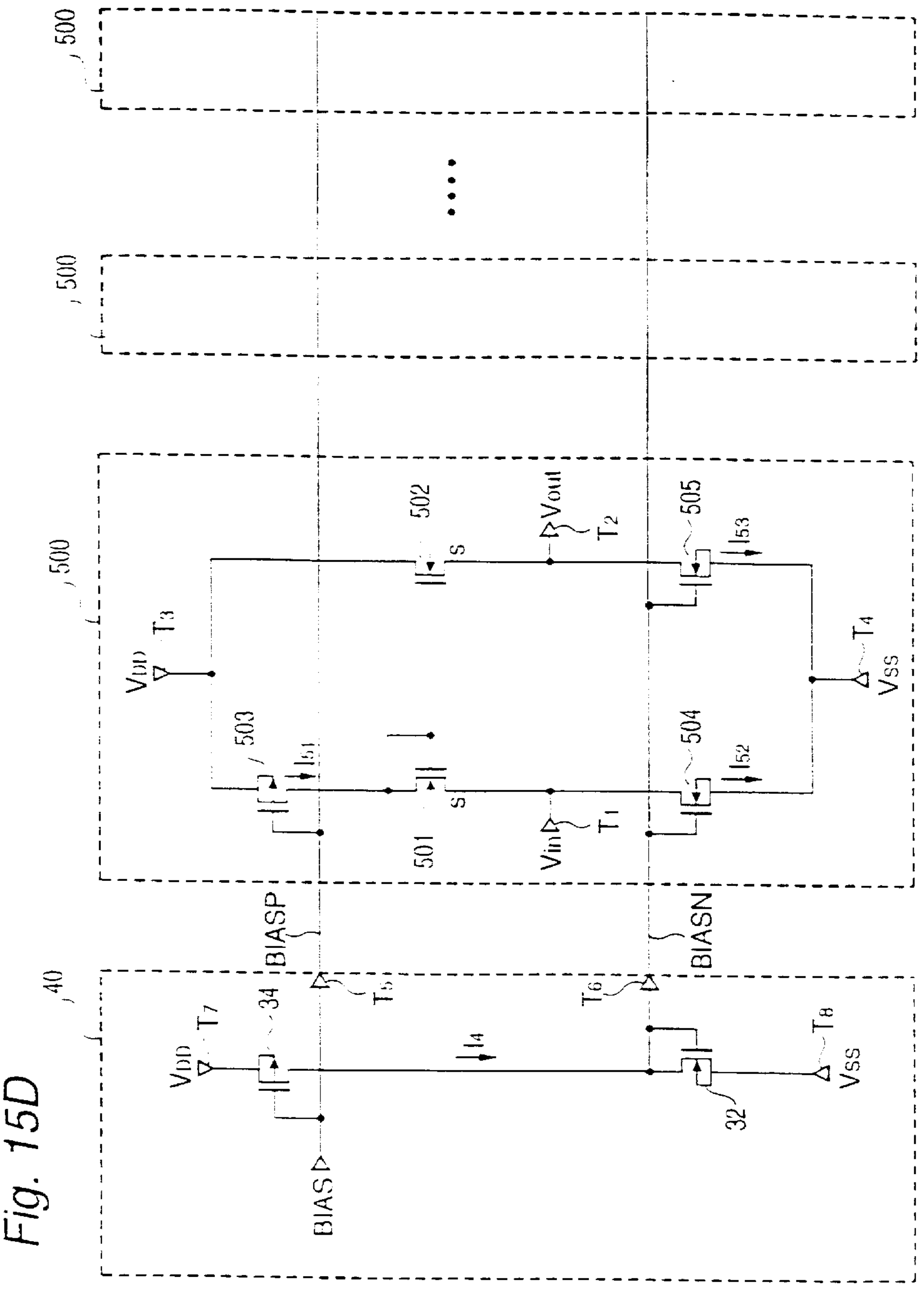
FIGS. 15D, 15E and 15F are circuit diagrams for illustrating examples in which one bias circuit shown in FIG. 15A is connected in common to a plurality of drive circuits.
Figure 15E:
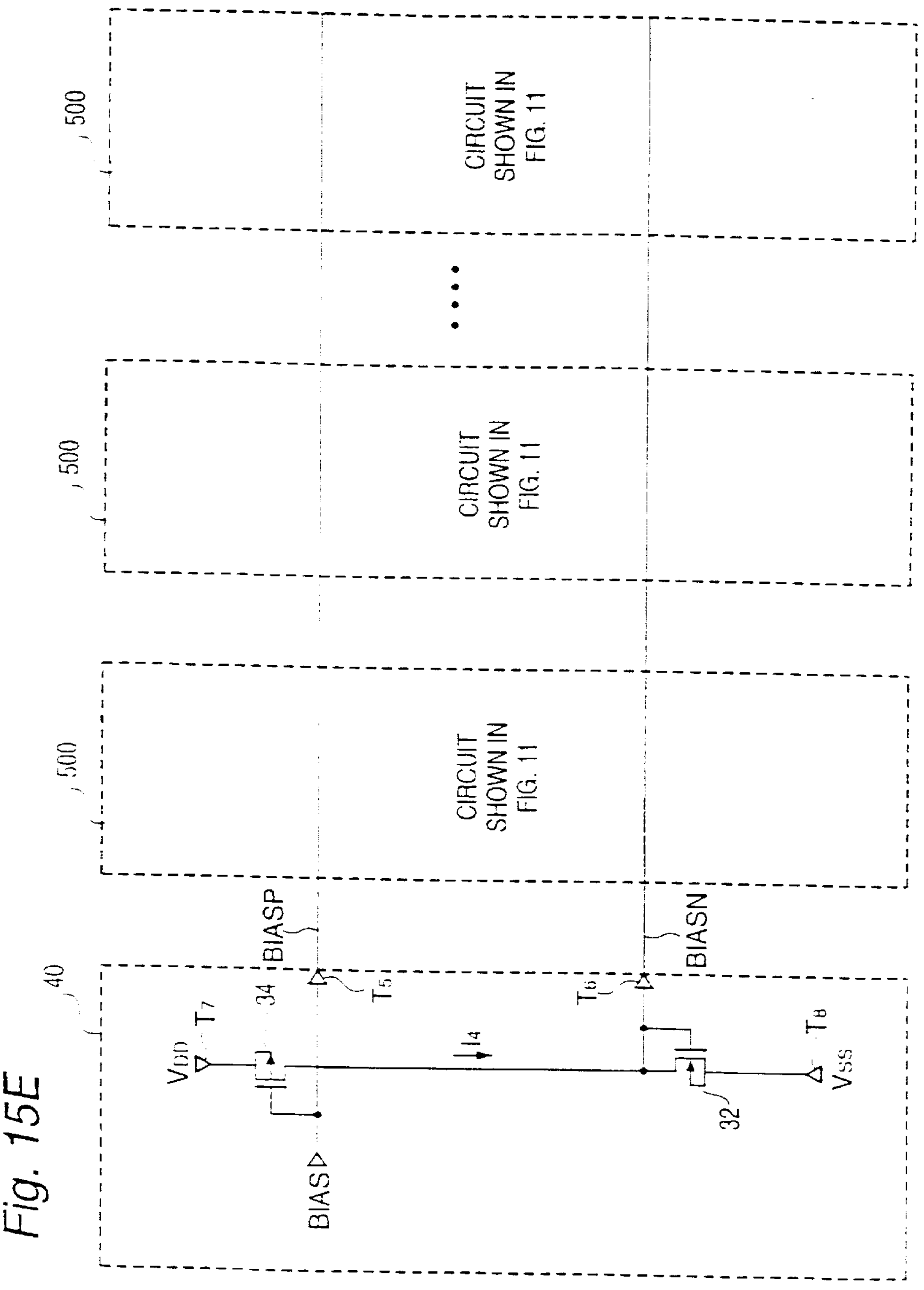
Figure 15F:
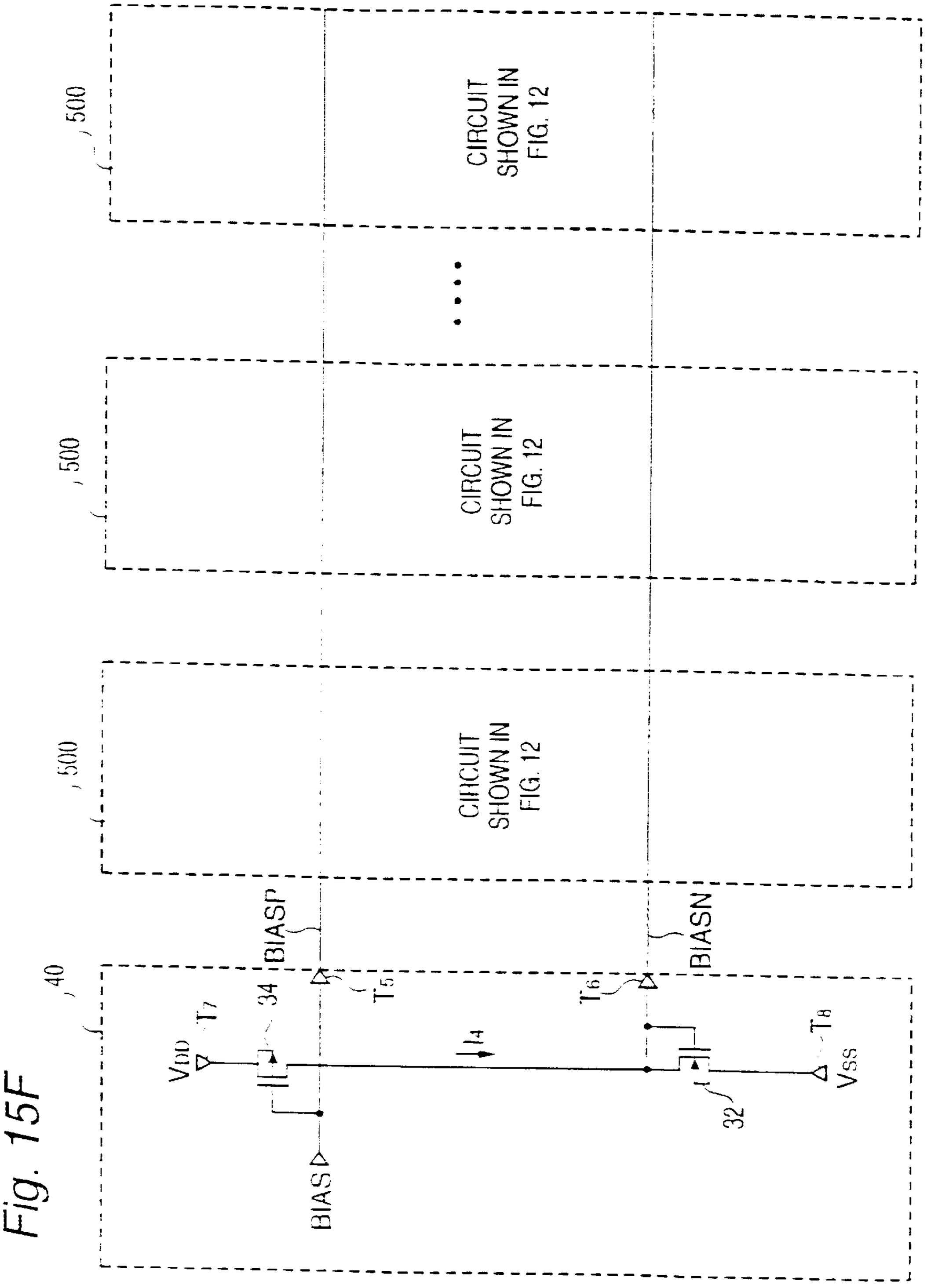
Figure 16:
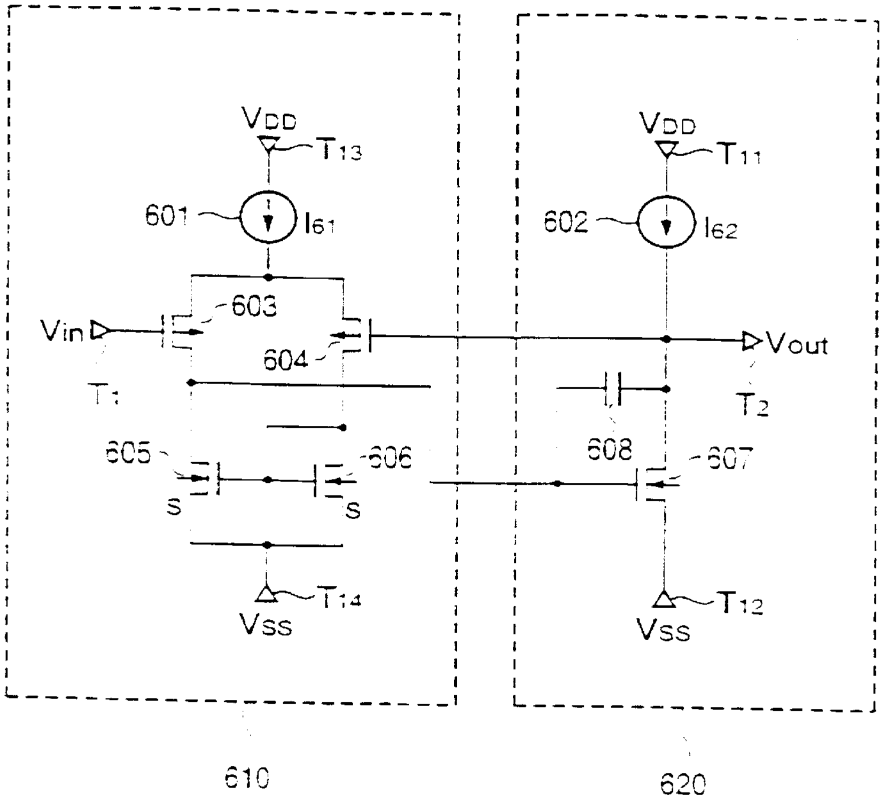
Fig. 16 Prior Art
FIG. 16 is a circuit diagram of a prior art drive circuit.

Referring to FIG. 15A, there is shown a circuit diagram of a modification of the current control circuit shown in FIG. 14A. A bias circuit 40 shown in FIG. 15A is different from the bias circuit 30 shown in FIG. 14A in that the transistors 31 and 33 are omitted to reduce the current amount flowing in the bias circuit. In the circuit shown in FIG. 15A, the external bias voltage BIAS is applied directed to the drive circuit 500 and the gate of the transistor 34 in the bias circuit 40, as the bias voltage BIASP, and the current 14 is controlled by the external bias voltage BIAS.

In the circuit shown in FIG. 15A, similarly to the circuit shown in FIG. 14A, if the device sizes of the PMOS transistors 34 and 503 and the NMOS transistors 32 and 504 are designed by considering a characteristics variation of transistors and the currents $I_4$, $I_{51}$ and $I_{52}$ are set to equalize the currents $I_{51}$ and $I_{52}$, even if the characteristics of transistors varies, the drive circuit can be made independent of a current supplying capacity of an external circuit supplying the input voltage Vin. Furthermore, if the device sizes of the PMOS transistors 34 and 503 and the NMOS transistors 32 and 50 are designed by considering a characteristics variation of transistors and the currents $I_4$, $I_{51}$ and $i_{53}$ are set to equalize respective gate-source voltages of the transistors 501 and 502, even if the characteristics of transistors varies, it is possible to supply the output voltage Vout equal to the input voltage Vin. Thus, an advantageous operation similar to that obtained in the bias circuit 30 can be obtained.

Here, it would be apparent to persons skilled in the art that the drive circuit 500 shown in FIGS. 14A and 15A can be replaced with the drive circuit shown in FIG. 11 or 12, as shown in FIGS. 14B and 14C and FIGS. 15B and 15C, or alternatively, another embodiment of the drive circuit. In addition, in the embodiments shown in FIGS. 14A and 15A, one bias circuit 30 or 40 is provided for only one drive circuit 500. However, in the case that a plurality of drive circuits 500 are provided, one bias circuit 30 or 40 can be provided in common to the plurality of drive circuits 500, as shown in FIGS. 14D, 14E and 14F and FIGS. 15D, 15E and 15F.

In the above mentioned embodiments, it would be apparent to persons skilled in the art that since the current control circuits can be considered to be constant current sources, even if the current control circuits can be replaced with constant current sources, a similar advantage can be obtained.

As seen from the above, the drive circuit in accordance with the present invention has a very simple circuit construction including a pair of transistors having respective gates connected in common, the gate of a first transistor being connected to a drain of the first transistor itself, and a second transistor being operated in a source-follower fashion. By controlling the drain-source current of the pair of transistors, the drive circuit can drive a capacitive load with a high current supplying capacity. Here, it would be apparent to persons skilled in the art that the drive circuit in accordance with the present invention is in no way limited to the driving of the liquid crystal display (LCD), but can be effectively used for driving other data lines (which constitutes a capacitive load) such as data lines for a TFT-OLED (thin film transistor—organic light emitting diode) display in which a plurality of different voltage levels corresponding to a plurality of gradation levels are selectively supplied to each data.

The invention has thus been shown and described with reference to the specific embodiments. However, it should be noted that the present invention is in no way limited to the details of the illustrated structures but changes and modifications may be made within the scope of the appended claims.

What is claimed is:

1. A drive circuit comprising a first power supply terminal, an input terminal for receiving an input voltage, an output terminal for outputting an output voltage, a first transistor having a source connected to said input terminal and a drain and a gate connected in common, a second transistor of the same conductivity type as that of said first transistor, said second transistor having a drain connected to said first power supply terminal, a source connected to said output terminal, and a gate connected to receive a voltage equal to a gate voltage of said first transistor, a first current control means for supplying a constant current flowing through a drain-source path of said first transistor, and a second current control, means for supplying a constant current flowing through a drain-source path of said second transistor, wherein said first current control means includes a first current control circuit connected between said first power supply terminal and said drain of said first transistor, and said second current control means includes a second current control circuit connected between said output terminal and a second power supply terminal, and further including at least a first switch connected in series with said first transistor between said input terminal and said first power supply terminal and on-off controlled for cutting off a current flowing between said input terminal and said first power supply terminal, a second switch connected in series with said second current control circuit between said output terminal and said second power supply terminal and on-off controlled for cutting off a current flowing between said output terminal and said second power supply terminal, and a third switch connected in series with said second transistor between said output terminal and said first power supply terminal and on-off controlled for cutting off a current flowing between said output terminal and said first power supply terminal.

2. A drive circuit claimed in claim 1, further including a precharging means for precharging said output terminal to at least one predetermined voltage.

3. A drive circuit comprising a first power supply terminal, an input terminal for receiving an input voltage, an output terminal for outputting an output voltage, a first transistor having a source connected to said input terminal and a drain and a gate connected in common, a second transistor of the same conductivity type as that of said first transistor, said second transistor having a drain connected to said first power supply terminal, a source connected to said output terminal, and a gate connected to receive a voltage equal to a gate voltage of said first transistor, a first current control means for supplying a constant current flowing through a drain-source path of said first transistor, and a second current control means for supplying a constant current flowing through a drain-source path of said second transistor, wherein said first current control means includes a first current control circuit connected between said first power supply terminal and said drain of said first transistor, and said second current control means includes a second current control circuit connected between said output terminal and a second power supply terminal, and further including at least a first switch connected in series with said first transistor between said input terminal and said first power supply terminal and on-off controlled for cutting off a current flowing between said input terminal and said first power supply terminal, a second switch connected in series with said second current control circuit between said output terminal and said second power supply terminal and on-off controlled for cutting off a current flowing between said output terminal and said second power supply terminal, and a third switch connected in series with said second transistor between said output terminal and said first power supply terminal and on-off controlled for cutting off a current flowing between said output terminal and said first power supply terminal, and further including a precharging means for precharging said gate of said first transistor to a first predetermined voltage.

4. A drive circuit comprising a first power supply terminal, an input terminal for receiving an input voltage, an output terminal for outputting an output voltage, a first transistor having a source connected to said input terminal and a drain and a gate connected in common, a second transistor of the same conductivity type as that of said first transistor, said second transistor having a drain connected to said first power supply terminal, a source connected to said output terminal, and a gate connected to receive a voltage equal to a gate voltage of said first transistor, a first current control means for supplying a constant current flowing through a drain-source path of said first transistor, and a second current control means for supplying a constant current flowing through a drain-source path of said second transistor, wherein said first current control means includes a first current control circuit connected between said first power supply terminal and said drain of said first transistor, and said second current control means includes a second current control circuit connected between said output terminal and a second power supply terminal, and further including at least a first switch connected in series with said first transistor between said input terminal and said first power supply terminal and on-off controlled for cutting off a current flowing between said input terminal and said first power supply terminal, a second switch connected in series with said second current control circuit between said output terminal and said second power supply terminal and on-off controlled for cutting off a current flowing between said output terminal and said second power supply terminal, and a third switch connected in series with said second-transistor between said output terminal and said first power supply terminal and on-off controlled for cutting off a current flowing between said output terminal and said first power supply terminal, and further including a first precharging means for precharging said output terminal to at least one predetermined voltage, and a second precharging means for precharging said gate of said first transistor to a first predetermined voltage.

5. A drive circuit comprising a first power supply terminal, an input terminal for receiving an input voltage, an output terminal for outputting an output voltage, a first transistor having a source connected to said input terminal and a drain and a gate connected in common, a second transistor of the same conductivity type as that of said first transistor, said second transistor having a drain connected to said first power supply terminal, a source connected to said output terminal, and a gate connected to receive a voltage equal to a gate voltage of said first transistor, a first current control means for supplying a constant current flowing through a drain-source path of said first transistor, and a second current control means for supplying a constant current flowing through a drain-source path of said second transistor, wherein said first current control means includes a first current control circuit connected between said first power supply terminal and said drain of said first transistor, and said second current control means includes a second current control circuit connected between said output terminal and a second power supply terminal, and further including a third current control circuit connected between said input terminal and said second power supply terminal, and at least a first switch connected in series with said first transistor between said input terminal and said first power supply terminal and on-off controlled for cutting off a current flowing between said input terminal and said first power supply terminal, a second switch connected in series with said second current control circuit between said output terminal and said second power supply terminal and on-off controlled for cutting off a current flowing between said output terminal and said second power supply terminal, a third switch connected in series with said third current control circuit between said input terminal and said second power supply terminal and on-off controlled for cutting off a current flowing between said input terminal and said second power supply terminal, and a fourth switch connected in series with said second transistor between said output terminal and said first power supply terminal and on-off controlled for cutting off a current flowing between said output terminal and said first power supply terminal.

6. A drive circuit claimed in claim 5, further including a precharging means for precharging said output terminal to at least one predetermined voltage.

7. A drive circuit claimed in claim 5, further including a precharging means for precharging said output terminal to at least predetermined voltage.

8. A drive circuit claimed in claim 5, further including a first precharging means for precharging said output terminal to at least one predetermined voltage, and a second precharging means for precharging said gate of said first transistor to a first predetermined voltage.

9. A drive circuit claimed in claim 5, wherein each of said first, second and third current control circuits is constituted of a field effect transistor having a drain-source path current which is controlled by controlling a gate-source voltage of said field effect transistor.

10. A drive circuit system comprising an input terminal for receiving an input voltage, an output terminal for outputting an output voltage, and first and second drive circuits each connected to said input terminal and said output terminal, so that one of said first and second drive circuits is selectively put in an operating condition on the basis of the input voltage, said first drive circuit including:

a first n-channel transistor having a source connected to said input terminal and a drain and a gate connected in common;

a second n-channel transistor having a drain connected to a first power supply terminal, a source connected to said output terminal, and a gate connected to receive a voltage equal to a gate voltage of said first n-channel transistor;

a first current control means for supplying a constant drain-source path current of said first n-channel transistor; and a second current control means for supplying a constant drain-source path current of said second n-channel transistor, said second drive circuit including:

a first p-channel transistor having a source connected to said input terminal and a drain and a gate connected in common;

a second p-channel transistor having a drain connected to a second power supply terminal, a source connected to said output terminal, and a gate connected to receive a voltage equal to a gate voltage of said first p-channel transistor;

a third current control means for supplying a constant drain-source path current of said first p-channel transistor; and a fourth current control means for supplying a constant drain-source path current of said second p-channel transistor, wherein said first current control means includes a first constant current source connected between said first power supply terminal and said drain of said first n-channel transistor;

wherein said second current control means includes a second constant current source connected between said output terminal and said second power supply terminal;

wherein said third current control means includes a third constant current source connected between said second power supply terminal and said drain of said first p-channel transistor;

wherein said fourth current control means includes a fourth constant current source connected between said output terminal and said first power supply terminal, and wherein said first drive circuit includes at least a first switch connected in series with said first n-channel transistor between said input terminal and said first power supply terminal and on-off controlled for cutting off a current flowing between said input terminal and said first power supply terminal, a second switch connected in series with said second current control circuit between said output terminal and said second power supply terminal and on-off controlled for cutting off a current flowing between said output terminal and said second power supply terminal, a third switch connected in series with said second n-channel transistor between said output terminal and said first power supply terminal and on-off controlled for cutting off a current flowing between said output terminal and said first power supply terminal, and wherein said second drive circuit includes at least a fourth switch connected in series with said first p-channel transistor between said input terminal and said second power supply terminal and on-off controlled for cutting off a current flowing between said input terminal and said second power supply terminal, a fifth switch connected in series with said fourth current control circuit between said output terminal and said first power supply terminal and on-off controlled for cutting off a current flowing between said output terminal and said first power supply terminal, a sixth switch connected in series with said second p-channel transistor between said output terminal and said second power supply terminal and on-off controlled for cutting off a current flowing between said output terminal and said second power supply terminal.

11. A drive circuit system claimed in claim 10, further including a precharging means for precharging said output terminal to at least one predetermined voltage.

12. A drive circuit system claimed in claim 10, further including a first precharging means for precharging said gate of said first n-channel transistor to a first predetermined voltage, and a second precharging means for precharging said gate of said first p-channel transistor to a second predetermined voltage.

13. A drive circuit system claimed in claim 10, further including a first precharging means for precharging said output terminal to at least one predetermined voltage, a second precharging means for-precharging said gate of said first n-channel transistor to a first predetermined voltage, and a third precharging means for precharging said gate of said first p-channel transistor to a second predetermined voltage.

14. A drive circuit system comprising an input terminal for receiving an input voltage, an output terminal for outputting an output voltage, and first and second drive circuits each connected to said input terminal and said output terminal, so that one of said first and second drive circuits is selectively put in an operating condition on the basis of the input voltage, said first drive circuit including:

a first n-channel transistor having a source connected to said input terminal and a drain and a gate connected in common;

a second n-channel transistor having a drain connected to a first power supply terminal, a source connected to said output terminal, and a gate connected to receive a voltage equal to a gate voltage of said first n-channel transistor;

a first current control means for supplying a constant drain-source path current of said first n-channel transistor; and a second current control means for supplying a constant drain-source path current of said second n-channel transistor, said second drive circuit including:

a first p-channel transistor having a source connected to said input terminal and a drain and a gate connected in common;

a second p-channel transistor having a drain connected to a second power supply terminal, a source connected to said output terminal, and a gate connected to receive a voltage equal to a gate voltage of said first p-channel transistor;

a third current control means for supplying a constant drain-source path current of said first p-channel transistor; and a fourth current control means for supplying a constant drain-source path current of said second p-channel transistor, wherein said first current control means includes a first constant current source connected between said first power supply terminal and said drain of said first n-channel transistor;

wherein said second current control means includes a second constant current source connected between said output terminal and said second power supply terminal;

wherein said third current control means includes a third constant current source connected between said second power supply terminal and said drain of said first p-channel transistor;

wherein said fourth current control means includes a fourth constant current source connected between said output terminal and said first power supply terminal, and wherein said first drive circuit includes a fifth current control circuit connected between said input terminal and said second power supply terminal, and wherein said second drive circuit includes a sixth current control circuit connected between said input terminal and said first power supply terminal, and wherein said first drive circuit includes at least a first switch connected in series with said first n-channel transistor between said input terminal and said first power supply terminal and on-off controlled for cutting off a current flowing between said input terminal and said first power supply terminal, a second switch connected in series with said second current control circuit between said output terminal and said second power supply terminal and on-off controlled for cutting off a current flowing between said output terminal and said second power supply terminal, a third switch connected in series with said fifth current control circuit between said input terminal and said second power supply terminal and on-off controlled for cutting off a current flowing between said input terminal and said second power supply terminal, and a fourth switch connected in series with said second n-channel transistor between said output terminal and said first power supply terminal and on-off controlled for cutting off a current flowing between said output terminal and said first power supply terminal, and wherein said second drive circuit includes at least a fifth switch connected in series with said first p-channel transistor between said input terminal and said second power supply terminal and on-off controlled for cutting off a current flowing between said input terminal and said second power supply terminal, a sixth switch connected in series with said fourth current control circuit between said output terminal and said first power supply terminal and on-off controlled for cutting off a current flowing between said output terminal and said first power supply terminal, a seventh switch connected in series with said sixth current control circuit between said input terminal and said first power supply terminal and on-off controlled for cutting off a current flowing between said input terminal and said first power supply terminal, and an eighth switch connected in series with said second p-channel transistor between said output terminal and said second power supply terminal and on-off controlled for cutting off a current flowing between said output terminal and said second power supply terminal.

15. A drive circuit system claimed in claim 14, further including a precharging means for precharging said output terminal to at least one predetermined voltage.

16. A drive circuit system claimed in claim 14, further including a first precharging means for precharging said gate of said first n-channel transistor to a first predetermined voltage, and a second precharging means for precharging said gate of said first p-channel transistor to a second predetermined voltage.

17. A drive circuit system claimed in claim 14, further including a first precharging means for precharging said output terminal to at least one predetermined voltage, a second precharging means for precharging said gate of said first n-channel transistor to a first predetermined voltage, and a third precharging means for precharging said gate of said first p-channel transistor to a second predetermined voltage.

18. A drive circuit system claimed in claim 14, wherein each of said first to sixth current control circuits is constituted of a field effect transistor having a drain-source path current which is controlled by controlling a gate-source voltage of said field effect transistor.

* * * * *